US012597956B2

(12) United States Patent
Kuroyanagi

(10) Patent No.: US 12,597,956 B2
(45) Date of Patent: Apr. 7, 2026

(54) RADIO FREQUENCY MODULE AND COMMUNICATION DEVICE

(71) Applicant: Murata Manufacturing Co., Ltd., Kyoto (JP)

(72) Inventor: Takuma Kuroyanagi, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 351 days.

(21) Appl. No.: 18/318,248

(22) Filed: May 16, 2023

(65) Prior Publication Data

US 2023/0291426 A1      Sep. 14, 2023

Related U.S. Application Data

(63) Continuation of application No. PCT/JP2021/045395, filed on Dec. 9, 2021.

(30) Foreign Application Priority Data

Dec. 14, 2020     (JP) ................................. 2020-207015

(51) Int. Cl.
*H04B 1/38*          (2015.01)
*H03H 9/25*          (2006.01)
          (Continued)

(52) U.S. Cl.
CPC ................. *H04B 1/38* (2013.01); *H03H 9/25* (2013.01); *H03H 9/64* (2013.01); *H03H 9/72* (2013.01)

(58) Field of Classification Search
CPC .......... H04B 1/38; H04B 1/0057; H04B 1/40; H03H 9/25; H03H 9/64; H03H 9/72;
          (Continued)

(56) References Cited

U.S. PATENT DOCUMENTS

| | | | | |
|---|---|---|---|---|
| 10,320,356 B2 * | 6/2019 | Yazaki | ................. | H01F 27/292 |
| 2012/0287589 A1 * | 11/2012 | Watanabe | ........... | H03H 9/0566 |
| | | | | 361/783 |

(Continued)

FOREIGN PATENT DOCUMENTS

| | | |
|---|---|---|
| JP | S61-227040 A | 10/1986 |
| JP | 2020-113559 A | 7/2020 |

(Continued)

OTHER PUBLICATIONS

International Search Report for PCT/JP2021/045395 dated Feb. 1, 2022.

*Primary Examiner* — Dhaval V Patel
(74) *Attorney, Agent, or Firm* — McDonald Hopkins LLC

(57)          ABSTRACT

In the radio frequency module, a first electronic component and a second electronic component are mounted on a principal surface of a mounting board. A resin layer covers an outer perimeter surface of the first electronic component and an outer perimeter surface of the second electronic component. A conductive layer covers the resin layer and overlaps the first electronic component and the second electronic component in a plan view. The conductive layer includes a first conductive portion and a second conductive portion. The first conductive portion is positioned in between the first RF terminal of the first electronic component and the second RF terminal of the second electronic component in the plan view. The second conductive portion is adjacent to the first conductive portion in the plan view. The resistivity of the first conductive portion is higher than the resistivity of the second conductive portion.

18 Claims, 20 Drawing Sheets

(51) Int. Cl.
  *H03H 9/64*    (2006.01)
  *H03H 9/72*    (2006.01)

(58) Field of Classification Search
  CPC ............. H03H 9/02913; H03H 9/0542; H03H
      9/0576; H03H 9/725; H01L 23/00; H01L
        25/04; H01L 25/18; H05K 9/00
  See application file for complete search history.

(56)       References Cited

U.S. PATENT DOCUMENTS

| | | | |
|---|---|---|---|
| 2014/0131853 A1 * | 5/2014 | Takemura ............... | H10D 64/20 |
| | | | 257/734 |
| 2014/0184019 A1 * | 7/2014 | Yamato ................. | H03H 9/725 |
| | | | 310/313 R |
| 2017/0273183 A1 | 9/2017 | Kawasaki et al. | |
| 2018/0204781 A1 | 7/2018 | Otsubo | |
| 2018/0317324 A1 * | 11/2018 | Yonemori ............... | H05K 1/147 |
| 2019/0074125 A1 * | 3/2019 | Yoshioka ............ | H01F 27/2804 |
| 2020/0014365 A1 | 1/2020 | Nambu et al. | |
| 2020/0020645 A1 | 1/2020 | Nakajima | |
| 2020/0235714 A1 | 7/2020 | Jeong et al. | |

FOREIGN PATENT DOCUMENTS

| | | |
|---|---|---|
| JP | 2020-115616 A | 7/2020 |
| WO | 2014/013831 A1 | 1/2014 |
| WO | 2016/088681 A1 | 6/2016 |
| WO | 2017/047539 A1 | 3/2017 |
| WO | 2018/181932 A1 | 10/2018 |

* cited by examiner

RADIO FREQUENCY MODULE AND COMMUNICATION DEVICE

CROSS REFERENCE TO RELATED APPLICATION

This is a continuation of International Application No. PCT/JP2021/045395 filed on Dec. 9, 2021 which claims priority from Japanese Patent Application No. 2020-207015 filed on Dec. 14, 2020. The contents of these applications are incorporated herein by reference in their entireties.

BACKGROUND ART

Technical Field

The present disclosure generally relates to radio frequency modules and communication devices, and more specifically relates to a radio frequency module including an electronic component and a communication device including such a radio frequency module.

Patent Document 1 discloses a module (radio frequency module) that includes a module board (mounting board), a duplexer (electronic component) mounted on a mount surface of the module board, a resin layer, and a metal film (conductive layer).

In the module disclosed in Patent Document 1, the resin layer is provided on the mount surface of the mounting board in such a manner as to cover a side surface of the electronic component. The metal film is formed on an upper surface of the electronic component and an upper surface of the resin layer.

Patent Document 1: International Publication No. 2014/013831

BRIEF SUMMARY

In a radio frequency module, of two electronic components, the isolation between a first RF terminal (for example, input terminal) included in one of the two electronic components (first electronic component) and a second RF terminal (for example, output terminal) included in the other electronic component (second electronic component) degrades in some cases. Further, in a radio frequency module, the isolation between a first RF terminal (for example, input terminal) and a second RF terminal (for example, output terminal) included in one electronic component degrades in some cases.

The present disclosure provides a radio frequency module and a communication device, each of which enables the improvement of isolation.

A radio frequency module according to one aspect of the present disclosure includes a mounting board, a first electronic component, a second electronic component, a resin layer, and a conductive layer. The mounting board has a principal surface. The first electronic component includes a plurality of first external terminals that includes a first RF terminal. The first electronic component is mounted on the principal surface of the mounting board using the plurality of first external terminals. The second electronic component includes a plurality of second external terminals that includes a second RF terminal. The second electronic component is mounted on the principal surface of the mounting board using the plurality of second external terminals. The resin layer is arranged on the principal surface of the mounting board and covers at least an outer perimeter surface of the first electronic component and an outer perimeter surface of the second electronic component. The conductive layer covers the resin layer and overlaps the first electronic component and the second electronic component in a plan view seen from a thickness direction of the mounting board. The conductive layer includes a first conductive portion and a second conductive portion. The first conductive portion is positioned in between the first RF terminal and the second RF terminal in the plan view seen from the thickness direction of the mounting board. The second conductive portion is adjacent to the first conductive portion in the plan view seen from the thickness direction of the mounting board. The resistivity of the first conductive portion is higher than the resistivity of the second conductive portion.

A radio frequency module according to another aspect of the present disclosure includes a mounting board, an electronic component, a resin layer, and a conductive layer. The mounting board has a principal surface. The electronic component includes a plurality of external terminals. The electronic component is mounted on the principal surface of the mounting board using the plurality of external terminals. The resin layer is arranged on the principal surface of the mounting board and covers at least an outer perimeter surface of the electronic component. The conductive layer covers the resin layer and overlaps the electronic component in a plan view seen from a thickness direction of the mounting board. The plurality of external terminals of the electronic component includes a first RF terminal and a second RF terminal. The conductive layer includes a first conductive portion and a second conductive portion. The first conductive portion is positioned in between the first RF terminal and the second RF terminal in the plan view seen from the thickness direction of the mounting board. The second conductive portion is adjacent to the first conductive portion in the plan view seen from the thickness direction of the mounting board. The resistivity of the first conductive portion is higher than the resistivity of the second conductive portion.

A radio frequency module according to still another aspect of the present disclosure includes a mounting board, a first electronic component, a second electronic component, a resin layer, and a conductive layer. The mounting board has a principal surface. The first electronic component includes a plurality of first external terminals that includes a first RF terminal. The first electronic component is mounted on the principal surface of the mounting board using the plurality of first external terminals. The second electronic component includes a plurality of second external terminals that includes a second RF terminal. The second electronic component is mounted on the principal surface of the mounting board using the plurality of second external terminals. The resin layer is arranged on the principal surface of the mounting board and covers at least an outer perimeter surface of the first electronic component and an outer perimeter surface of the second electronic component. The conductive layer covers the resin layer and overlaps the first electronic component and the second electronic component in a plan view seen from a thickness direction of the mounting board. The conductive layer includes a first conductive portion and a second conductive portion. The first conductive portion is positioned in between the first RF terminal and the second RF terminal in the plan view seen from the thickness direction of the mounting board. The second conductive portion is adjacent to the first conductive portion in the plan view seen from the thickness direction of the mounting board. The second conductive portion includes a first metal layer including a first metal material and a second metal layer formed on the first metal layer, and the second metal layer includes a second metal material that is different from the first metal material. The first conductive portion includes an alloy portion including the first metal material and the second metal material.

A communication device according to one aspect of the present disclosure includes the radio frequency module according to any one of the foregoing aspects and a signal processing circuit. The signal processing circuit is connected to the radio frequency module.

The radio frequency modules and the communication device according to the foregoing aspects of the present disclosure enable the improvement of isolation.

BRIEF DESCRIPTION OF THE DRAWINGS

FIG. 1 is a sectional view of a radio frequency module according to an embodiment 1.

FIG. 5 is a partially broken plan view of a radio frequency module according to a modified example 1 of the embodiment 1.

FIG. 10 is a sectional view of a radio frequency module according to a modified example 6 of the embodiment 1.

FIG. 12 is a sectional view of a radio frequency module according to a modified example 8 of the embodiment 1.

FIG. 15 is a sectional view of a radio frequency module according to an embodiment 3.

FIG. 16 is a partially broken plan view of the foregoing radio frequency module.

FIG. 17 is a sectional view of a radio frequency module according to an embodiment 4.

FIG. 18 is a sectional view of a radio frequency module according to a modified example 1 of the embodiment 4.

DETAILED DESCRIPTION

Figure 2:
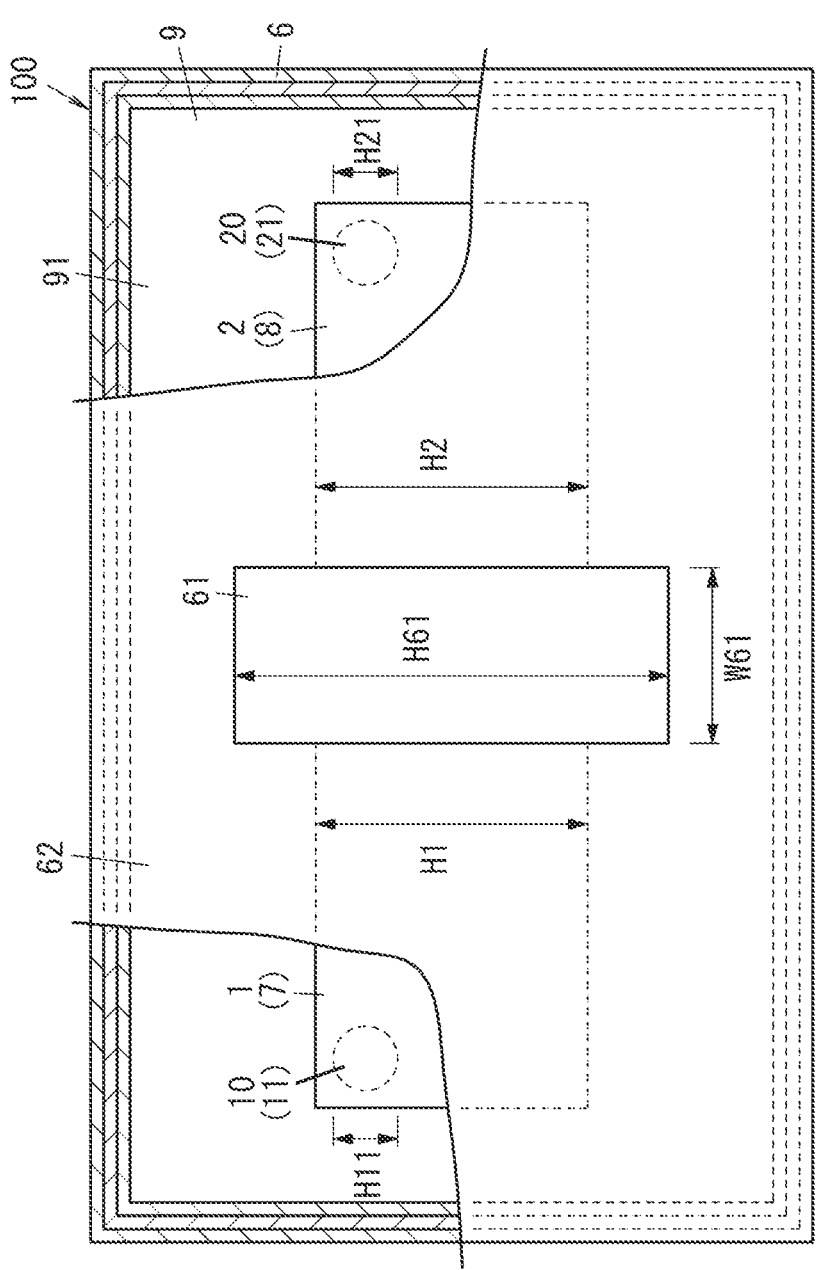
FIG. 2 is a partially broken plan view of the foregoing radio frequency module.

Respective drawings being referred in the following embodiments and the like are all schematic diagrams, and each ratio of sizes or thicknesses of constituent elements in the drawings does not necessarily reflect the actual ratio of dimensions.

Embodiment 1

Figure 1:
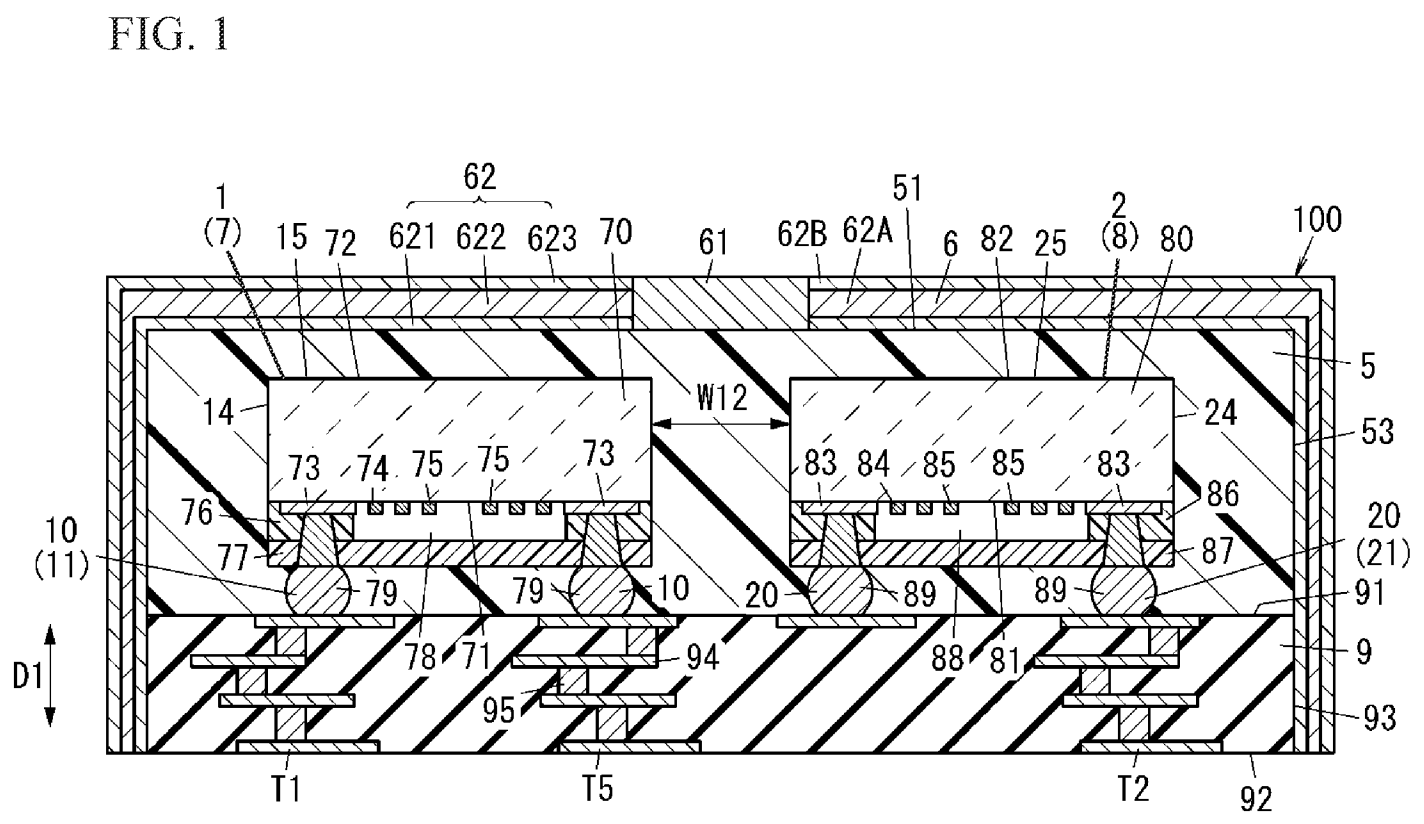

As illustrated in FIG. 1 and FIG. 2, a radio frequency module 100 according to an embodiment 1 includes a mounting board 9, a first electronic component 1, a second electronic component 2, a resin layer 5, and a conductive layer 6. The mounting board 9 has a principal surface 91. The first electronic component 1 and the second electronic component 2 are mounted on the principal surface 91 of the mounting board 9. The resin layer 5 is arranged on the principal surface 91 of the mounting board 9 and covers an outer perimeter surface 14 of the first electronic component 1 and an outer perimeter surface 24 of the second electronic component 2. Further, the resin layer 5 covers an upper surface 15 of the first electronic component 1 and an upper surface 25 of the second electronic component 2. The conductive layer 6 covers the resin layer 5. In FIG. 2, the illustration of the resin layer 5 is omitted.

Hereinafter, the radio frequency module 100 and a communication device 300 according to the embodiment 1 are described more specifically with reference to FIG. 1 to FIG. 4.

(1) Radio Frequency Module and Communication Device (1.1) Circuit Configurations of Radio Frequency Module and Communication Device Circuit configurations of the radio frequency module 100 and the communication device 300 according to the embodiment 1 are described with reference to FIG. 3 and FIG. 4.

Figure 4:
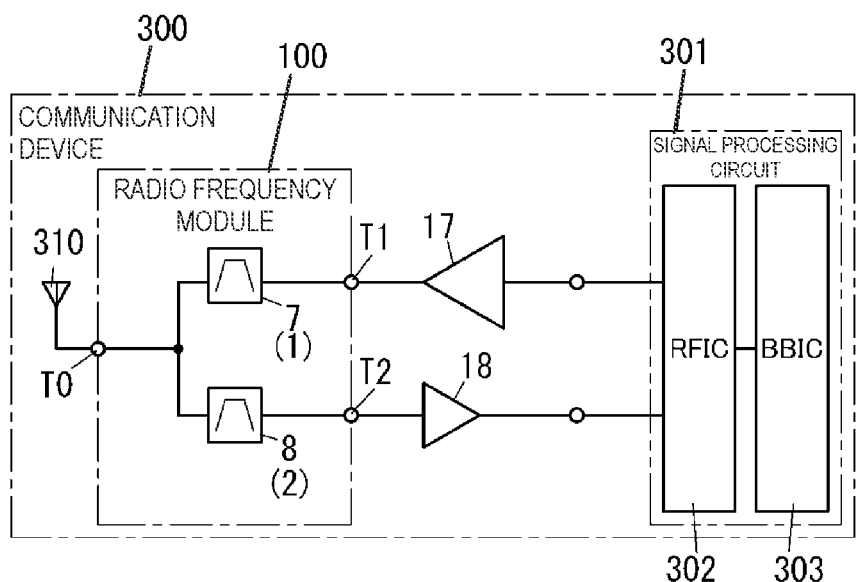
FIG. 4 is a circuit diagram of a communication device including the foregoing radio frequency module.

As illustrated in FIG. 4, for example, the radio frequency module 100 is used in the communication device 300. The communication device 300 is, for example, a mobile phone (for example, a smartphone). However, the communication device 300 is not limited to the mobile phone and may be, for example, a wearable terminal (for example, a smart watch) or the like. The radio frequency module 100 is, for example, a module compatible with the 4G (fourth generation mobile telecommunications) standard, the 5G (fifth generation mobile telecommunications) standard, or the like. The 4G standard is, for example, the 3GPP (Third Generation Partnership Project) LTE (Long Term Evolution) standard. The 5G standard is, for example, the 5G NR (New Radio).

The communication device 300 includes the radio frequency module 100, an antenna 310, a power amplifier 17, a low-noise amplifier 18, and a signal processing circuit 301. The communication device 300 further includes the antenna 310. The communication device 300 is configured, for example, in such a manner as to amplify a transmit signal input to the power amplifier 17 from the signal processing circuit 301 and output the amplified signal to the antenna 310. Further, the communication device 300 is configured in such a manner as to amplify a receive signal input to the radio frequency module 100 from the antenna 310 using the low-noise amplifier 18 and output the amplified signal to the signal processing circuit 301. The signal processing circuit 301 is not a constituent element of the radio frequency module 100 and is a constituent element of the communication device 300 that includes the radio frequency module 100. Further, the power amplifier 17 and low-noise amplifier 18 are not constituent elements of the radio frequency module 100 but are constituent elements of the communication device 300. However, the power amplifier 17 and low-noise amplifier 18 may alternatively be constituent elements of the radio frequency module 100. The communication device 300 further includes a circuit board on which the radio frequency module 100 is mounted. The circuit board is, for example, a printed wiring board. The circuit board includes a ground electrode to which a ground potential is given.

The signal processing circuit 301 includes, for example, a RF signal processing circuit 302 and a baseband signal processing circuit 303. The RF signal processing circuit 302 is, for example, a RFIC (Radio Frequency Integrated Circuit) and performs signal processing on a radio frequency signal. For example, the RF signal processing circuit 302 performs signal processing on a radio frequency signal (transmit signal) output from the baseband signal processing circuit 303 using up-converting and the like, and outputs a radio frequency signal on which the signal processing has been performed. Further, for example, the RF signal processing circuit 302 performs signal processing on a radio frequency signal (receive signal) output from the low-noise amplifier 18 using down-converting and the like, and outputs a radio frequency signal, on which the signal processing has been performed, to the baseband signal processing circuit 303. The baseband signal processing circuit 303 is, for example, a BBIC (Baseband Integrated Circuit). The baseband signal processing circuit 303 generates an I-phase signal and a Q-phase signal from a baseband signal. The baseband signal is, for example, an audio signal, an image signal, or the like input from outside. The baseband signal processing circuit 303 performs IQ modulation processing by combining the I-phase signal and the Q-phase signal and outputs a transmit signal. At this time, the transmit signal is generated as a modulated signal (IQ signal) by performing amplitude modulation on a carrier signal of a predetermined frequency with a period longer than the period of this carrier signal. The receive signal processed in the baseband signal processing circuit 303 is used, for example, as an image signal for image display or as an audio signal for user's calls in the communication device 300. The radio frequency module 100 transmits the radio frequency signals (receive signal and transmit signal) between the antenna 310 and the RF signal processing circuit 302 of the signal processing circuit 301.

Figure 3:
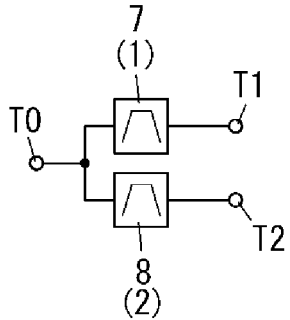
FIG. 3 is a circuit diagram of the foregoing radio frequency module.

As illustrated in FIG. 3 and FIG. 4, the radio frequency module 100 includes a transmit filter 7 and a receive filter 8. The transmit filter 7 is, for example, a filter whose pass band is a transmit band of a first communication band. The first communication band corresponds to a transmit signal that passes through the transmit filter 7. The first communication band is, for example, a communication band of the 3GPP LTE standard or a communication band of the 5G NR standard. The receive filter 8 is, for example, a filter whose pass band is a receive band of the first communication band. The first communication band is, for example, a communication band of the 3GPP LTE standard or a communication band of the 5G NR standard. In the radio frequency module 100, the transmit filter 7 and the receive filter 8 make up a first duplexer. In the radio frequency module 100, the transmit filter 7 makes up the first electronic component 1 described above. Accordingly, the first electronic component 1 is a transmit system circuit component to be provided in a signal path of the transmit signal. Further, in the radio frequency module 100, the receive filter 8 makes up the second electronic component 2 described above. Accordingly, the second electronic component 2 is a circuit component of receive system to be provided in a signal path of the receive signal.

Further, the radio frequency module 100 includes an antenna terminal T0, a transmit terminal (signal input terminal) T1, a receive terminal (signal output terminal) T2, a plurality of ground terminals T5 (only one ground terminal T5 is seen in FIG. 1). The plurality of ground terminals T5 are terminals to which a ground potential is given.

The power amplifier 17 includes an input terminal and an output terminal. The power amplifier 17 amplifies a transmit signal input to the input terminal and outputs an amplified transmit signal from the output terminal. In the communication device 300, the input terminal of the power amplifier 17 is connected to the signal processing circuit 301. In the communication device 300, the output terminal of the power amplifier 17 is connected to the transmit terminal T1. The power amplifier 17 is, for example, a multi-stage amplifier that includes a driver stage amplifier and a final stage amplifier. In the power amplifier 17, an input terminal of the driver stage amplifier is connected to the signal processing circuit 301, an output terminal of the driver stage amplifier is connected to an input terminal of the final stage amplifier, and an output terminal of the final stage amplifier is connected to the transmit terminal T1. The power amplifier 17 is not limited to a multi-stage amplifier, and may alternatively be, for example, an in-phase composite amplifier, a differential composite amplifier, or a Doherty amplifier The low-noise amplifier 18 includes an input terminal and an output terminal. The low-noise amplifier 18 amplifies a receive signal input to the input terminal and outputs an amplified receive signal from the output terminal. In the communication device 300, the input terminal of the low-noise amplifier 18 is connected to the receive terminal T2. In the communication device 300, the output terminal of the low-noise amplifier 18 is connected to the signal processing circuit 301.

(1.2) Structure of Radio Frequency Module

As illustrated in FIG. 1 and FIG. 2, the radio frequency module 100 includes the mounting board 9, the transmit filter 7, and the receive filter 8.

The mounting board 9 has the principal surface 91 (hereinafter, also referred to as the first principal surface 91). The mounting board 9 has the first principal surface 91 and a second principal surface 92, which face each other in a thickness direction D1 of the mounting board 9. The mounting board 9 is, for example, a multilayer board including a plurality of dielectric layers and a plurality of conductive layers 94. The plurality of dielectric layers and the plurality of conductive layers 94 are stacked on top of each other in the thickness direction D1 of the mounting board 9. Each of the plurality of conductive layers 94 is formed in a predetermined pattern, which is set for each layer. Each of the plurality of conductive layers 94 includes one or more conductor portions in a single plane orthogonal to the thickness direction D1 of the mounting board 9. The material of each conductive layer 94 is, for example, copper. The plurality of conductive layers 94 includes a ground layer. In the radio frequency module 100, the plurality of ground terminals T5 and the ground layer are electrically connected by via conductors 95 or the like included in the mounting board 9. The mounting board 9 is, for example, a LTCC (Low Temperature Co-fired Ceramics) board. The mounting board 9 is not limited to a LTCC board and may alternatively be, for example, a printed wiring board, a HTCC (High Temperature Co-fired Ceramics) board, or a resin multilayer board.

Further, the mounting board 9 is not limited to a LTCC board, and may alternatively be, for example, a wiring structure. The wiring structure is, for example, a multilayer structure. The multilayer structure includes at least one insulating layer and at least one conductive layer. The insulating layer is formed in a predetermined pattern. In the case where a plurality of the insulating layers is included, each of the plurality of the insulating layers is formed in a predetermined pattern, which is set for each layer. The conductive layer is formed in a predetermined pattern that is different from the predetermined pattern of the insulating layer. In the case where a plurality of conductive layers is included, each of the plurality of conductive layers is formed in a predetermined pattern, which is set for each layer. The conductive layer may include one or more redistribution portions. In the wiring structure, of two surfaces facing each other in the thickness direction of the multilayer structure, a first surface is the first principal surface 91 of the mounting board 9, and a second surface is the second principal surface 92 of the mounting board 9. The wiring structure may be, for example, an interposer. The interposer may be an interposer that uses a silicon board or a board made up of multiple layers.

The first principal surface 91 and the second principal surface 92 of the mounting board 9 are separated from each other in the thickness direction D1 of the mounting board 9, and cross the thickness direction D1 of the mounting board 9. The first principal surface 91 of the mounting board 9 is, for example, orthogonal to the thickness direction D1 of the mounting board 9. However, the first principal surface 91 of the mounting board 9 may include, for example, a side surface of a conductor portion or the like as a surface that is not orthogonal to the thickness direction D1. Further, the second principal surface 92 of the mounting board 9 is, for example, orthogonal to the thickness direction D1 of the mounting board 9. However, the second principal surface 92 of the mounting board 9 may include, for example, a side surface of a conductor portion or the like as a surface that is not orthogonal to the thickness direction D1. Further, micro-asperities, dips, or bumps may be formed on the first principal surface 91 and the second principal surface 92 of the mounting board 9. For example, in the case where dips are formed on the first principal surface 91 of the mounting board 9, an inner surface of the dip is included in the first principal surface 91.

In the radio frequency module 100, the first electronic component 1 (transmit filter 7) is mounted on the principal surface 91 of the mounting board 9. "The first electronic component 1 is mounted on the principal surface 91 of the mounting board 9" means to include the case where the first electronic component 1 is arranged on (mechanically connected to) the principal surface 91 of the mounting board 9 and the case where the first electronic component 1 is electrically connected to (an appropriate conductor portion of) the mounting board 9. In the radio frequency module 100, the first electronic component 1 includes a plurality of first external terminals 10 and is mounted on the principal surface 91 of the mounting board 9 using the plurality of first external terminals 10. In the radio frequency module 100, the second electronic component 2 is also mounted on the principal surface 91 of the mounting board 9. "The second electronic component 2 is mounted on the principal surface 91 of the mounting board 9" means to include the case where the second electronic component 2 is arranged on (mechanically connected to) the principal surface 91 of the mounting board 9 and the case where the second electronic component 2 is electrically connected to (an appropriate conductor portion of) the mounting board 9. In the radio frequency module 100, the second electronic component 2 includes a plurality of second external terminals 20 and is mounted on the principal surface 91 of the mounting board 9 using the plurality of second external terminals 20.

The transmit filter 7 is, for example, a ladder filter and includes a plurality of (for example, four) series arm resonators and a plurality of (for example, three) parallel arm resonators. The transmit filter 7 is, for example, an acoustic wave filter. In the acoustic wave filter, each of the plurality of series arm resonators and the plurality of parallel arm resonators is made up of an acoustic wave resonator. The acoustic wave filter is, for example, a surface acoustic wave filter that utilizes a surface acoustic wave. In the surface acoustic wave filter, each of the plurality of series arm resonators and the plurality of parallel arm resonators is, for example, a SAW (Surface Acoustic Wave) resonator.

As illustrated in FIG. 1 and FIG. 2, the transmit filter 7 that makes up the first electronic component 1 is mounted on the principal surface 91 of the mounting board 9. In the plan view seen from the thickness direction D1 of the mounting board 9, the outer perimeter of the transmit filter 7 has a square shape. The outer perimeter surface 14 of the first electronic component 1 includes, in the first electronic component 1, four side surfaces that connect the upper surface 15 (principal surface on the opposite side of the mounting board 9 side) and a lower surface (principal surface on the mounting board 9 side). As illustrated in FIG. 1, for example, the transmit filter 7 includes a board 70 and a circuit portion 74. The board 70 has a first principal surface 71 and a second principal surface 72, which face each other in a thickness direction of the board 70. The thickness direction of the board 70 is a direction along the thickness direction D1 of the mounting board 9. The circuit portion 74 includes a plurality of IDT (Interdigital Transducer) electrodes 75 formed on the first principal surface 71 of the board 70. The transmit filter 7 includes a plurality of wiring electrodes 73 formed on the first principal surface 71 of the board 70. The plurality of wiring electrodes 73 are connected to the circuit portion 74. Further, the transmit filter 7 includes, as constituent elements of a package structure, a spacer layer 76, a cover member 77, and a plurality of external terminals 79. The plurality of external electrodes 79 are connected to the wiring electrodes 73 that overlap the plurality of external terminals 79 in the thickness direction of the board 70, out of the plurality of wiring electrodes 73. In the radio frequency module 100, the plurality of external terminals 79 of the transmit filter 7 makes up the plurality of first external terminals 10 of the first electronic component 1. Further, of the plurality of external terminals 79, the external terminal 79 that serves as the input terminal of a radio frequency signal (transmit signal) makes up the first RF terminal 11 included in the plurality of first external terminals 10. In the radio frequency module 100 according to the embodiment 1, the first RF terminal 11 is the first external terminal 10 that is connected to the transmit terminal T1, out of the plurality of first external terminals 10. In the plan view seen from the thickness direction D1 of the mounting board 9, the transmit filter 7 has a rectangular shape. However, the shape of the transmit filter 7 is not limited thereto and may alternatively be, for example, a square shape. In the transmit filter 7, the board 70 is a piezoelectric board and is, for example, a lithium tantalate board or a lithium niobate board.

The spacer layer 76 is provided on the first principal surface 71 side of the board 70. The spacer layer 76 surrounds the plurality of IDT electrodes 75 in the plan view seen from the thickness direction of the board 70. In the plan view seen from the thickness direction of the board 70, the spacer layer 76 has a rectangular frame-like shape. The spacer layer 76 has electrically insulating property. The material of the spacer layer 76 is epoxy resin, polyimide, or the like. The cover member 77 has a plate-like shape. The cover member 77 is arranged on the spacer layer 76 in such a manner as to face the board 70 in the thickness direction of the board 70. The cover member 77 overlaps the plurality of IDT electrodes 75 in the thickness direction of the board 70 and is separated from the plurality of IDT electrodes 75 in the thickness direction of the board 70. The cover member 77 has electrically insulating property. The material of the cover member 77 is epoxy resin, polyimide, or the like. The transmit filter 7 has a first void space 78 surrounded by the board 70, the spacer layer 76, and the cover member 77. The first void space 78 is filled with gas. The gas is air, an inert gas (for example, nitrogen gas), or the like. The plurality of external terminals 79 are exposed outside the cover member 77.

The receive filter 8 is, for example, a ladder filter and includes a plurality of (for example, four) series arm resonators and a plurality of (for example, three) parallel arm resonators. The receive filter 8 is, for example, an acoustic wave filter. In the acoustic wave filter, each of the plurality of series arm resonators and the plurality of parallel arm resonators is made up of an acoustic wave resonator. The acoustic wave filter is, for example, a surface acoustic wave filter that utilizes a surface acoustic wave. In the surface acoustic wave filter, each of the plurality of series arm resonators and the plurality of parallel arm resonators is, for example, a SAW resonator.

As illustrated in FIG. 1 and FIG. 2, the receive filter 8 that makes up the second electronic component 2 is mounted on the principal surface 91 of the mounting board 9. In the plan view seen from the thickness direction D1 of the mounting board 9, the outer perimeter of the receive filter 8 has a square shape. The outer perimeter surface 24 of the second electronic component 2 includes, in the second electronic component 2, four side surfaces that connect the upper surface 25 (principal surface on the opposite side of the mounting board 9 side) and a lower surface (principal surface on the mounting board 9 side). As illustrated in FIG. 1, the receive filter 8 includes a board 80 and a circuit portion 84. The board 80 has a first principal surface 81 and a second principal surface 82, which face each other in a thickness direction of the board 80. The thickness direction of the board 80 is a direction along the thickness direction D1 of the mounting board 9. The circuit portion 84 includes a plurality of IDT electrodes 85 formed on the first principal surface 81 of the board 80. The receive filter 8 includes a plurality of wiring electrodes 83 formed on the first principal surface 81 of the board 80. The plurality of wiring electrodes 83 are connected to the circuit portion 84. Further, the receive filter 8 includes, as constituent elements of a package structure, a spacer layer 86, a cover member 87, and a plurality of external terminals 89. The plurality of external electrodes 89 are connected to the wiring electrodes 83 that overlap the plurality of external terminals 89 in the thickness direction of the board 80, out of the plurality of wiring electrodes 83. In the radio frequency module 100, the plurality of external terminals 89 of the receive filter 8 makes up the plurality of second external terminals 20 of the second electronic component 2. Further, of the plurality of external terminals 89, the external terminal 89 that serves as the output terminal of a radio frequency signal (receive signal) makes up the second RF terminal 21 included in the plurality of second external terminals 20. In the radio frequency module 100 according to the embodiment 1, the second RF terminal 21 is the second external terminal 20 that is connected to the receive terminal T2, out of the plurality of second external terminals 20. In the plan view seen from the thickness direction D1 of the mounting board 9, the receive filter 8 has a rectangular shape. However, the shape of the receive filter 8 is not limited thereto and may alternatively be, for example, a square shape. In the receive filter 8, the board 80 is a piezoelectric board and is, for example, a lithium tantalate board or a lithium niobate board.

The spacer layer 86 is provided on the first principal surface 81 side of the board 80. The spacer layer 86 surrounds the plurality of IDT electrodes 85 in the plan view seen from the thickness direction of the board 80. In the plan view seen from the thickness direction of the board 80, the spacer layer 86 has a rectangular frame-like shape. The spacer layer 86 has electrically insulating property. The material of the spacer layer 86 is epoxy resin, polyimide, or the like. The cover member 87 has a plate-like shape. The cover member 87 is arranged on the spacer layer 86 in such a manner as to face the board 80 in the thickness direction of the board 80. The cover member 87 overlaps the plurality of IDT electrodes 85 in the thickness direction of the board 80 and is separated from the plurality of IDT electrodes 85 in the thickness direction of the board 80. The cover member 87 has electrically insulating property. The material of the cover member 87 is epoxy resin, polyimide, or the like. The receive filter 8 has a second void space 88 surrounded by the board 80, the spacer layer 86, and the cover member 87. The second void space 88 is filled with gas. The gas is an inert gas (for example, nitrogen gas) or the like. The plurality of external terminals 89 are exposed outside the cover member 87.

The radio frequency module 100 includes a plurality of external connection terminals. The plurality of external connection terminals includes the transmit terminal (signal input terminal) T1, the receive terminal (signal output terminal) T2, and the plurality of ground terminals T5 (only one ground terminal T5 is seen in FIG. 1). The plurality of external connection terminals is arranged on the second principal surface 92 of the mounting board 9. "The external connection terminal is arranged on the second principal surface 92 of the mounting board 9" means to include the case where the external connection terminal is mechanically connected to the second principal surface 92 of the mounting board 9 and the case where the external connection terminal is electrically connected to (an appropriate conductor portion of) the mounting board 9. The material of the plurality of external connection terminals is, for example, a metal (for example, copper, copper alloy, or the like). The plurality of external connection terminals are optional constituent elements of the mounting board 9, but may be included as suitable constituent elements of the mounting board 9. Each of the plurality of external connection terminals may be a column-like electrode (for example, a cylindrical electrode) or a ball-like bump.

The plurality of ground terminals T5 is electrically connected to the ground layer of the mounting board 9. The ground layer is a circuit ground of the radio frequency module 100. The ground terminals included in the plurality of external terminals 79 of the transmit filter 7 are electrically connected to the ground layer of the mounting board 9.

The ground terminals included in the plurality of external terminals 89 of the receive filters 8 are electrically connected to the ground layer of the mounting board 9.

As illustrated in FIG. 1, the resin layer 5 is arranged on the principal surface 91 of the mounting board 9. The resin layer 5 covers the outer perimeter surface 14 of the first electronic component 1 and the outer perimeter surface 24 of the second electronic component 2, which are mounted on the principal surface 91 of the mounting board 9. Further, in the radio frequency module 100 according to the embodiment 1, the resin layer 5 covers the upper surface 25 of the first electronic component 1 and the upper surface 25 of the second electronic component 2. The resin layer 5 includes a resin (for example, epoxy resin). The resin layer 5 may include a filler in addition to the resin. The resin layer 5 has electrically insulating property.

The conductive layer 6 covers the resin layer 5. The conductive layer 6 has electrical conductivity. In the radio frequency module 100, the conductive layer 6 is provided for the purpose of electromagnetically shielding inside and outside of the radio frequency module 100. The conductive layer 6 covers a principal surface 51 of the resin layer 5 on the opposite side of the mounting board 9 side, an outer perimeter surface 53 of the resin layer 5, and an outer perimeter surface 93 of the mounting board 9. The conductive layer 6 is in contact with at least part of the outer perimeter surface of the ground layer included in the mounting board 9. Because of this, the electrical potential of the conductive layer 6 can be set equal to the electric potential of the ground layer.

The conductive layer 6 includes a first conductive portion 61 and a second conductive portion 62. The first conductive portion 61 is positioned in between the first RF terminal 11 of the first electronic component 1 and the second RF terminal 21 of the second electronic component 2 in the plan view seen from the thickness direction D1 of the mounting board 9. The second conductive portion 62 is adjacent to the first conductive portion 61 in the plan view seen from the thickness direction D1. With regard to the conductive layer 6, "the second conductive portion 62 is adjacent to the first conductive portion 61 in the plan view seen from the thickness direction D1" is defined to mean that the second conductive portion 62 and the first conductive portion 61 are adjacent to each other. In the radio frequency module 100 according to the embodiment 1, the second conductive portion 62 is a part other than the first conductive portion 61 in the plan view seen from the thickness direction D1. However, the second conductive portion 62 is not necessarily the whole of the part other than the first conductive portion 61. In the radio frequency module 100 according to the embodiment 1, the first electronic component 1 and the second electronic component 2 are adjacent to each other in the plan view seen from the thickness direction D1 of the mounting board 9. "The first electronic component 1 and the second electronic component 2 are adjacent to each other" is defined to means that in the plan view seen from the thickness direction D1 of the mounting board 9, no other circuit component is present between the first electronic component 1 and the second electronic component 2, and the first electronic component 1 and the second electronic component 2 lie next to each other.

With regard to the first conductive portion 61, "positioned in between the first RF terminal 11 of the first electronic component 1 and the second RF terminal 21 of the second electronic component 2 in the plan view seen from the thickness direction D1 of the mounting board 9" is defined to mean that in the plan view seen from the thickness direction D1 of the mounting board 9, any line connecting an arbitrary point of the first RF terminal 11 and an arbitrary point of the second RF terminal 21 crosses the first conductive portion 61. In the plan view seen from the thickness direction D1 of the mounting board 9, the first conductive portion 61 is separated from the first RF terminal 11 and the second RF terminal 21. In other words, in the plan view seen from the thickness direction D1 of the mounting board 9, the first conductive portion 61 does not overlap the first RF terminal 11 or the second RF terminal 21.

As illustrated in FIG. 2, in the plan view seen from the thickness direction D1 of the mounting board 9, in the direction orthogonal to the direction along which the first RF terminal 11 and the second RF terminal 21 are lined up, a length H61 of the first conductive portion 61 is longer than a length H11 of the first RF terminal 11 and a length H21 of the second RF terminal 21. In the plan view seen from the thickness direction D1 of the mounting board 9, in the direction orthogonal to the direction along which the first RF terminal 11 and the second RF terminal 21 are lined up, the length H61 of the first conductive portion 61 is longer than a length H1 of the first electronic component 1 and a length H2 of the second electronic component 2 and is shorter than a length of the mounting board 9. "In the plan view seen from the thickness direction D1 of the mounting board 9, the direction along which the first RF terminal 11 and the second RF terminal 21 are lined up" is the direction along which the center of the first RF terminal 11 and the center of the second RF terminal 21 are lined up in the plan view seen from the thickness direction D1 of the mounting board 9. In the plan view seen from the thickness direction D1 of the mounting board 9, the outer perimeter of each of the first RF terminal 11 and the second RF terminal 21 has, for example, a circular shape.

In the plan view seen from the thickness direction D1 of the mounting board 9, in the direction along which the first RF terminal 11 and the second RF terminal 21 are lined up, a length W61 of the first conductive portion 61 is longer than a distance W12 (see FIG. 1) between the first electronic component 1 and the second electronic component 2 and is shorter than the distance between the first RF terminal 11 and the second RF terminal 21.

In the radio frequency module 100, the second conductive portion 62 includes a first layer 621, a second layer 622 on the first layer 621, and a third layer 623 on the second layer 622. The first layer 621 covers the principal surface 51 and the outer perimeter surface 53 of the resin layer 5. The second layer 622 covers the first layer 621. The third layer 623 covers the second layer 622.

In the second conductive portion 62 of the radio frequency module 100 according to the embodiment 1, the first layer 621, the second layer 622, and the third layer 623 are a first SUS (stainless steel) layer, a Cu layer, and a second SUS (stainless steel) layer, respectively. The material of each of the first SUS layer and the second SUS layer is an alloy including Fe, Ni, and Cr. The material of the CU layer includes Cu. In the second conductive portion 62, of the first layer 621, the second layer 622, and the third layer 623, the resistivity of the second layer 622 is lower than the resistivity of the first layer 621 and the resistivity of the third layer 623. The material of the first layer 621 has a suitable adhesiveness to the resin layer 5 compared with the second layer 622. The material of the third layer 623 has a suitable oxidation resistivity compared with the second layer 622. Further, in the second conductive portion 62, the thickness of the second layer 622 is thicker than the thickness of the first layer 621 and the thickness of the third layer 623. The first layer 621, the second layer 622, and the third layer 623 may be a first Ti layer, a Cu layer, and a second Ti layer, respectively. Further, the first layer 621, the second layer 622, and the third layer 623 may be a first Ti layer, an Au layer, and a second Ti layer, respectively.

In the radio frequency module 100 according to the embodiment 1, the resistivity of the first conductive portion 61 is higher than the resistivity of the second conductive portion 62. Here, the resistivity of the first conductive portion 61 is the resistivity of an alloy portion of Cu and SUS. The resistivity of the second conductive portion 62 is the resistivity of the second layer 622 that has the lowest resistivity among a plurality of layers (the first layer, the second layer, and the third layer) that make up the second conductive layer 62, that is to say, the resistivity of the CU layer. The resistivity of the first conductive portion 61 and the resistivity of the second conductive portion 62 are values obtained by exposing sections of the first conductive portion 61 and the second conductive portion 62 of the conductive layer 6 and measuring the spreading resistance of the first conductive portion 61 and the spreading resistance of the second conductive portion 62 using scanning spreading resistance microscopy. Furthermore, the resistivity is a value obtained by converting the spreading resistance measured by scanning spreading resistance microscopy into the resistivity. At the time of converting the measured spreading resistance into the resistivity, the measured spreading resistance is converted into the resistivity by comparing the measured spreading resistance with the measurement value of the spreading resistance of a standard sample for calibration. In the case of discussing the relative magnitude relationship of the resistivity, the resistivity is not limited to a value obtained by measuring with a scanning spreading resistance microscope, and may alternatively be, for example, a value obtained by measuring using spreading resistance profiling.

(1.3) Fabrication Method of Radio Frequency Module

As the fabrication method of the radio frequency module 100, for example, a fabrication method including a first process, a second process, a third process, and a fourth process can be employed.

The first process is a process of mounting the first electronic component 1 and the second electronic component 2 on the principal surface 91 of the mounting board 9.

The second process is a process of forming the resin layer 5 that covers the first electronic component 1 and the second electronic component 2 on the principal surface 91 of the mounting board 9.

The third process is a process of forming a multilayer body of the first layer 621, the second layer 622, and the third layer 623 in such a manner as to cover the whole of the principal surface 51 and the whole of the outer perimeter surface 53 of the resin layer 5 and the whole of the outer perimeter surface 93 of the mounting board 9. In the third process, the method of forming the first layer 621, the second layer 622, and the third layer 623 is, for example, a sputtering method, an evaporation method, or a printing method.

The fourth process is a process of forming the first conductive portion 61 including an alloy portion of SUS and Cu by modifying the part of the multilayer body of the first layer 621, the second layer 622, and the third layer 623, which is positioned at an area where the first conductive portion 61 is to be formed, by irradiating that part with a laser beam. The fourth process can double as a printing process of printing a part number of the radio frequency module 100 or the like on the conductive layer 6 by irradiating a laser beam.

(2) Effects

(2.1) Radio Frequency Module

The radio frequency module 100 according to the embodiment 1 includes the mounting board 9, the first electronic component 1, the second electronic component 2, the resin layer 5, and the conductive layer 6. The mounting board 9 has the principal surface 91. The first electronic component 1 includes a plurality of first external terminals 10 including the first RF terminal 11. The first electronic component 1 is mounted on the principal surface 91 of the mounting board 9 using the plurality of first external terminals 10. The second electronic component 2 includes the plurality of second external terminals 20 including the second RF terminal 21. The second electronic component 2 is mounted on the principal surface 91 of the mounting board 9 using the plurality of second external terminals 20. The resin layer 5 is arranged on the principal surface 91 of the mounting board 9 and covers at least the outer perimeter surface 14 of the first electronic component 1 and the outer perimeter surface 24 of the second electronic component 2. The conductive layer 6 covers the resin layer 5 and overlaps the first electronic component 1 and the second electronic component 2 in the plan view seen from the thickness direction D1 of the mounting board 9. The conductive layer 6 includes the first conductive portion 61 and the second conductive portion 62. The first conductive portion 61 is positioned in between the first RF terminal 11 and the second RF terminal 21 in the plan view seen from the thickness direction D1 of the mounting board 9. The second conductive portion 62 is adjacent to the first conductive portion 61 in the plan view seen from the thickness direction D1 of the mounting board 9. The resistivity of the first conductive portion 61 is higher than the resistivity of the second conductive portion 62.

The radio frequency module 100 according to the embodiment 1 enables the improvement of isolation. In the radio frequency module 100, a first parasitic capacitor is formed between the first RF terminal 11 of the first electronic component 1 and (the second conductive portion 62 of) the conductive layer 6 in the thickness direction D1 of the mounting board 9. Further, in the radio frequency module 100, a second parasitic capacitor is formed between the second RF terminal 21 of the second electronic component 2 and (the second conductive portion 62 of) the conductive layer 6 in the thickness direction D1 of the mounting board 9. In the radio frequency module 100, because the conductive layer 6 includes the first conductive portion 61, there is a possibility that a leak path including the first RF terminal 11, the first parasitic capacitor, part of the conductive layer 6, the second parasitic capacitor, and the second RF terminal 21 is formed. However, the radio frequency module 100 includes the first conductive portion 61 positioned in between the first RF terminal 11 and the second RF terminal 21 in the plan view seen from the thickness direction D1 of the mounting board 9, and the resistivity of the first conductor portion 61 is higher than the resistivity of the second conductive portion 62. Thus, compared with the case where the resistivity of the first conductive portion 61 is the same as the resistivity of the second conductive portion 62, it becomes possible to further increase the resistance of the leak path. Because of this, the radio frequency module 100 enables the improvement of the isolation between the first RF terminal 11 of the first electronic component 1 and the second RF terminal 21 of the second electronic component 2.

A comparative example in which a slit exposing part of the principal surface 51 of the resin layer 5 is formed in the conductive layer 6 has a lower moisture resistance and is more likely to be affected by external noise. Further, in this comparative example, the slit becomes a dielectric substance of the parasitic capacitor, and the leak between the first RF terminal 11 of the first electronic component 1 and the second RF terminal 21 of the second electronic component 2 via the conductive layer 6 is likely to increase. On the other hand, the radio frequency module 100 according to the embodiment 1 can suppress the decrease of the moisture resistance and becomes less likely to be affected by external noise, and furthermore, enables the improvement of the isolation between the first RF terminal 11 of the first electronic component 1 and the second RF terminal 21 of the second electronic component 2.

In the radio frequency module 100, for example, the second layer 622 of the second conductive portion 62 can be specified as a first metal layer 62A including a first metal material (for example, Cu), and the third layer 623 of the second conductive portion 62 can be specified as a second metal layer 62B including a second metal material (for example, SUS) which is different from the first metal material. In this case, in the radio frequency module 100, the second conductive portion 62 includes the first metal layer 62A including the first metal material and the second metal layer 62B that is formed on the first metal layer 62A and includes the second metal material that is different from the first metal material, and the first conductive portion 61 includes an alloy portion including the first metal material and the second metal material. Accordingly, the radio frequency module 100 enables the improvement of isolation.

(2.2) Communication Device

The communication device 300 according to the embodiment 1 includes the signal processing circuit 301 and the radio frequency module 100. The signal processing circuit 301 is connected to the radio frequency module 100.

The communication device 300 according to the embodiment 1 includes the radio frequency module 100 and thus enables the improvement of isolation.

(3) Modified Examples of Radio Frequency Module

(3.1) Modified Example 1

Figure 5:
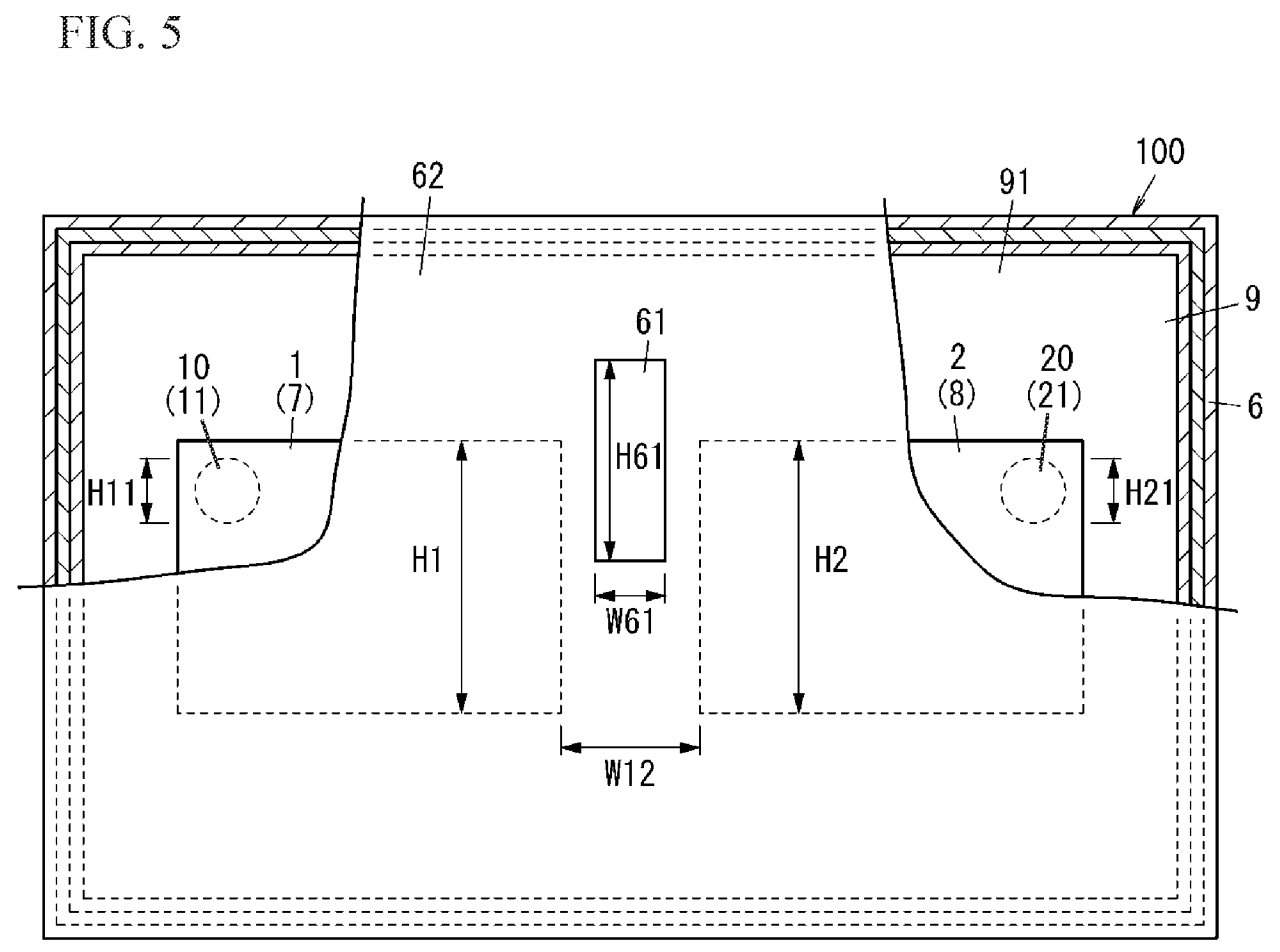

A radio frequency module 100 according to a modified example 1 of the embodiment 1 is described with reference to FIG. 5. With regard to the radio frequency module 100 according to the modified example 1, the same reference characters denote constituent elements similar to those of the radio frequency module 100 according to the embodiment 1, and the descriptions thereof are omitted.

The radio frequency module 100 according to the modified example 1 is different from the radio frequency module 100 according to the embodiment 1 in that a length H61 and a length W61 of the first conductive portion 61 are different from a length H61 and a length W61 of the first conductive portion 61 of the radio frequency module 100 according to the embodiment 1 in the plan view seen from the thickness direction D1 (see FIG. 1) of the mounting board 9.

In the radio frequency module 100 according to the modified example 1, the length H61 of the first conductive portion 61 is shorter than the length H1 of the first electronic component 1 and the length H2 of the second electronic component 2. Further, the length W61 of the first conductive portion 61 is shorter than the distance W12 between the first electronic component 1 and the second electronic component 2.

In the radio frequency module 100 according to the modified example 1, the first conductive portion 61 of the conductive layer 6 does not overlap the first electronic component 1 and the second electronic component 2 in the plan view seen from the thickness direction D1 of the mounting board 9.

(3.2) Modified Example 2

Figure 6:
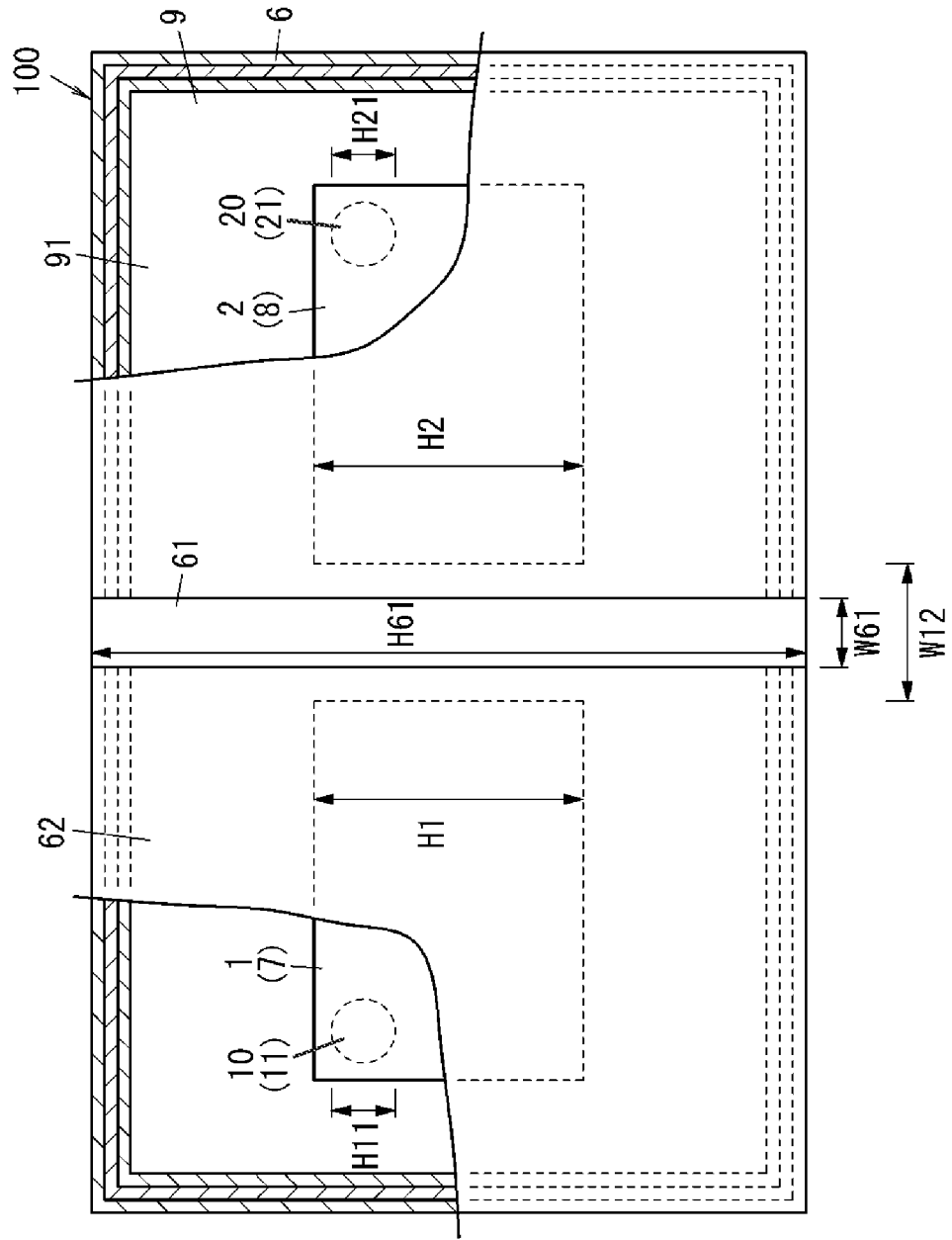
FIG. 6 is a partially broken plan view of a radio frequency module according to a modified example 2 of the embodiment 1.

A radio frequency module 100 according to a modified example 2 of the embodiment 1 is described with reference to FIG. 6. With regard to the radio frequency module 100 according to the modified example 2, the same reference characters denote constituent elements similar to those of the radio frequency module 100 according to the embodiment 1, and the descriptions thereof are omitted.

In the radio frequency module 100 according to the modified example 2, the length H61 of the first conductive portion 61 is longer than the length H1 of the first electronic component 1 and the length H2 of the second electronic component 2 in the plan view seen from the thickness direction D1 (see FIG. 1) of the mounting board 9. The first conductive portion 61 is formed across two edges of the conductive layer 6 in the plan view seen from the thickness direction D1 of the mounting board 9, and the length H61 of the first conductive portion 61 is longer than the length of the mounting board 9. Further, the length W61 of the first conductive portion 61 is shorter than the distance W12 between the first electronic component 1 and the second electronic component 2.

In the radio frequency module 100 according to the modified example 2, the first conductive portion 61 of the conductive layer 6 does not overlap the first electronic component 1 and the second electronic component 2 in the plan view seen from the thickness direction D1 of the mounting board 9.

In the radio frequency module 100 according to the modified example 2, it becomes possible to suppress the formation of a leak path caused by a signal entering into an unwanted part in the inside of the second conductive portion 62.

(3.3) Modified Example 3

Figure 7:
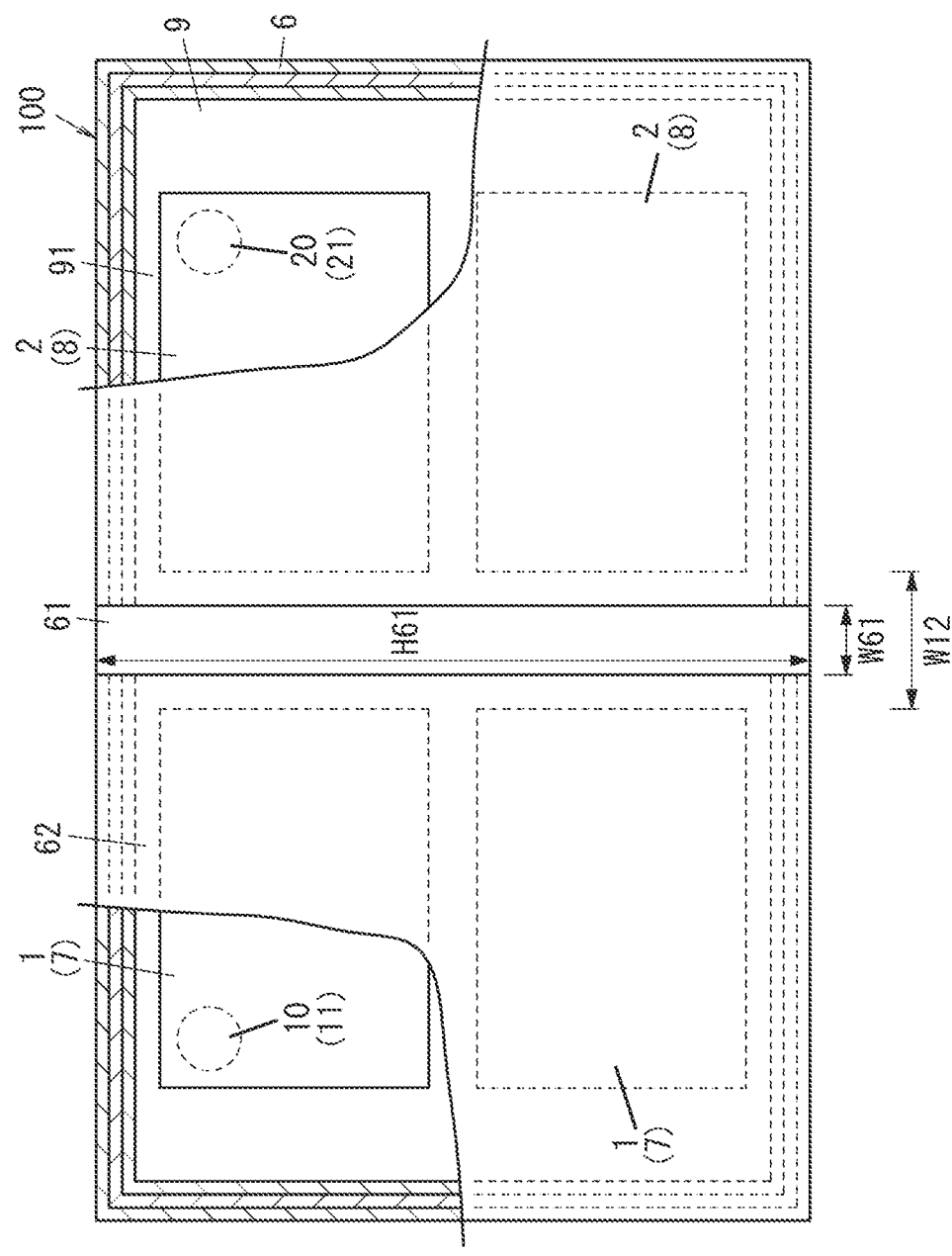
FIG. 7 is a partially broken plan view of a radio frequency module according to a modified example 3 of the embodiment 1.

A radio frequency module 100 according to a modified example 3 of the embodiment 1 is described with reference to FIG. 7. With regard to the radio frequency module 100 according to the modified example 3, the same reference characters denote constituent elements similar to those of the radio frequency module 100 according to the modified example 2 of the embodiment 1, and the descriptions thereof are omitted.

The radio frequency module 100 according to the modified example 3 includes two units of the first electronic components 1 (transmit filters 7) and two units of the second electronic components 2 (receive filters 8). These two transmit filters 7 are transmit filters whose pass bands are frequency bands different from each other. These two receive filters 8 are receive filters whose pass bands are frequency bands different from each other. The radio frequency module 100 according to the modified example 3 includes a first duplexer including the transmit filter 7 whose pass band is a first communication band and the receive band 8 whose receive band is the first communication band and a second duplexer including the transmit filter 7 whose pass band is a second communication band and the receive band 8 whose receive band is the second communication band.

(3.4) Modified Example 4

Figure 8:
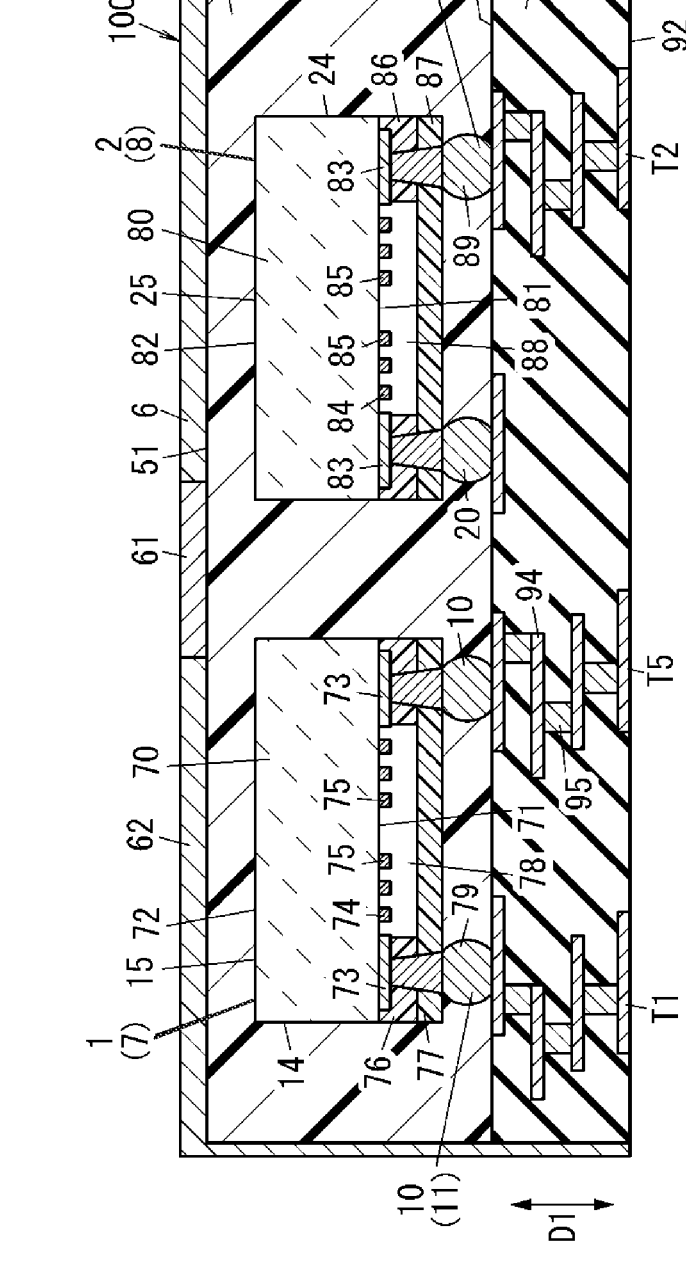
FIG. 8 is a sectional view of a radio frequency module according to a modified example 4 of the embodiment 1.

A radio frequency module 100 according to a modified example 4 of the embodiment 1 is described with reference to FIG. 8. With regard to the radio frequency module 100 according to the modified example 4, the same reference characters denote constituent elements similar to those of the radio frequency module 100 according to the embodiment 1, and the descriptions thereof are omitted.

In the radio frequency module 100 according to the modified example 4, the material of the first conductive portion 61 is, for example, SUS. The material of the first conductive portion 61 is not limited to SUS and may alternatively be, for example, Ti, Ni, or iron oxide. The first conductive portion 61 does not need to have a single layer structure and may alternatively have a multilayer structure such as, for example, a multilayer structure of a SUS layer and a Ni layer or a multilayer structure of a Ti layer and a Ni layer. The second conductive portion 62 has a single layer structure composed of a material having a resistivity lower than that of the first conductive portion 61. However, the structure of the second conductive portion 62 is not limited thereto and may alternatively have a multilayer structure of a first layer 621, a second layer 622, and a third layer 623, as is the case with the radio frequency module 100 according to the embodiment 1 (see FIG. 1).

The fabrication method of the radio frequency module 100 according to the modified example 4 is different from the fabrication method of the radio frequency module according to the embodiment 1. In the fabrication method of the radio frequency module according to the modified example 4, at the time of forming the conductive layer 6, the second conductive portion 62 that covers the principal surface 51 of the resin layer 5, the outer perimeter surface 53 of the resin layer 5, and the outer perimeter surface 93 of the mounting board 9 is formed, and subsequently the first conductive portion 61 is formed by utilizing a lift-off method.

With the radio frequency module 100 according to the modified example 4, the flexibility in selecting the material of the first conductive portion 61 increases.

(3.5) Modified Example 5

Figure 9:
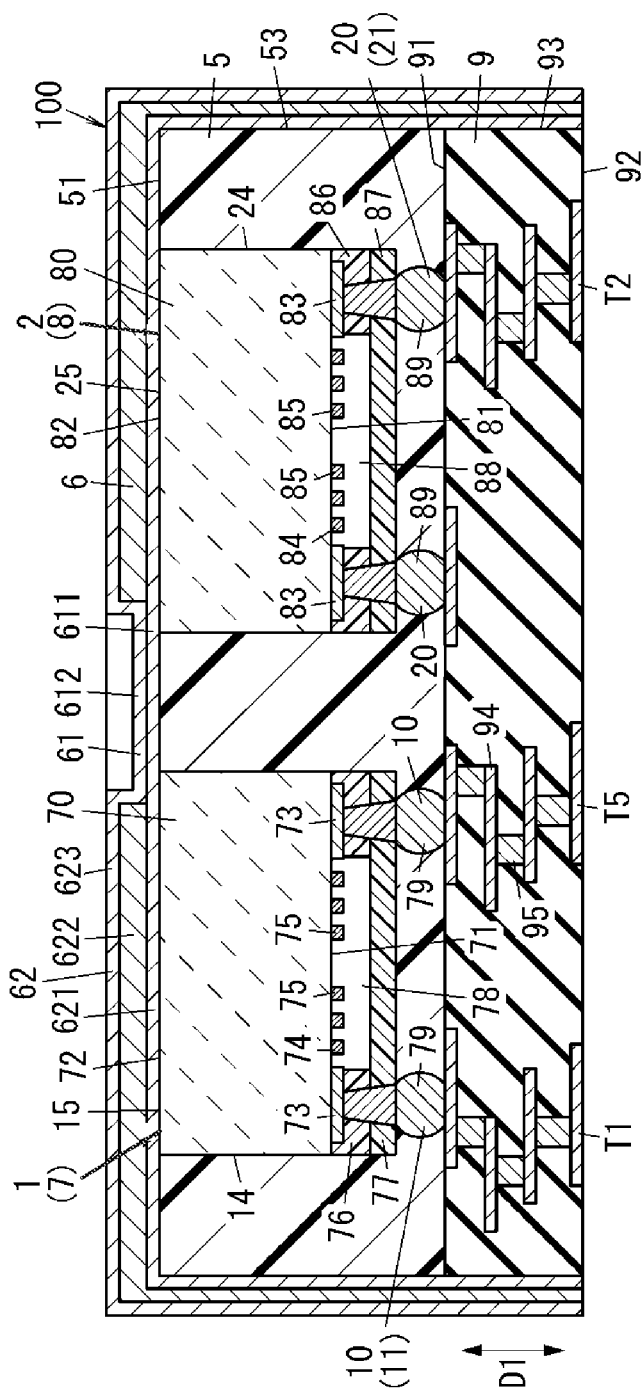
FIG. 9 is a sectional view of a radio frequency module according to a modified example 5 of the embodiment 1.

A radio frequency module 100 according to a modified example 5 of the embodiment 1 is described with reference to FIG. 9. With regard to the radio frequency module 100 according to the modified example 5, the same reference characters denote constituent elements similar to those of the radio frequency module 100 according to the embodiment 1, and the descriptions thereof are omitted.

The radio frequency module 100 according to the modified example 5 is different from the radio frequency module 100 according to the embodiment 1 in that the conductive layer 6 also covers the upper surface 15 of the first electronic component 1 and the upper surface 25 of the second electronic component 2 and that the upper surface 15 of the first electronic component 1 and the upper surface 25 of the second electronic component 2 are in contact with the conductive layer 6. Further, the radio frequency module 100 according to the modified example 5 is different from the radio frequency module 100 according to the embodiment 1 in that the first conductive portion 61 has a multilayer structure of a first layer 611 and a second layer 612.

In the radio frequency module 100 according to the modified example 5, the conductive layer 6 is in contact with the upper surface 25 of the first electronic component 1 throughout the whole area thereof, and thus, compared with the radio frequency module 100 according to the embodiment 1, it becomes possible to improve the heat dissipating property.

The first layer 611 of the first conductive portion 61 and the first layer 621 of the second conductive portion 62 are the same in their materials and their thicknesses. The material of the first layer 611 of the first conductive portion 61 is, for example, SUS. The first layer 611 of the first conductive portion 61 and the first layer 621 of the second conductive portion 62 form a single continuous layer without necessarily any boundary. The second layer 612 of the first conductive portion 61 and the third layer 623 of the second conductive portion 62 are the same in their materials and their thicknesses. The material of the second layer 612 of the first conductive portion 61 is, for example, SUS. The second layer 612 of the first conductive portion 61 and the third layer 623 of the second conductive portion 62 form a single continuous layer without necessarily any boundary. The material of the second layer 622 of the second conductive portion 62 is Cu.

The fabrication method of the radio frequency module 100 according to the modified example 5 is different from the fabrication method of the radio frequency module according to the embodiment 1.

As the fabrication method of the radio frequency module 100 according to the modified example 5, for example, a fabrication method including a first process, a second process, a third process, and a fourth process can be employed.

The first process is a process of mounting the first electronic component 1 and the second electronic component 2 on the principal surface 91 of the mounting board 9.

The second process is a process of forming a resin material layer that later becomes the resin layer 5 covering the first electronic component 1 and the second electronic component 2 on the principal surface 91 of the mounting board 9.

The third process is a process of forming the resin layer 5 and thinning both the first electronic component 1 and the second electronic component 2 by grinding the resin material layer from the principal surface of the first resin material layer on the opposite side of the mounting board 9 side and further grinding the resin material layer, the first electronic component 1, and the second electronic component 2. In the third process, the upper surface 15 of the first electronic component 1 and the upper surface 25 of the second electronic component 2 are made coarse (roughened) by grinding the first electronic component 1 and the second electronic component 2.

The fourth process is a process of forming the conductive layer 6. The fourth process includes a first step, a second step, and a third step, and in the first step, the first layer 611 of the first conductive portion 61 and the first layer 621 of the second conductive portion 62 are formed in such a manner as to cover the resin layer 5 using, for example, a sputtering method, an evaporation method, or a printing method. In the second step, the second layer 622 of the second conductive portion 62 is formed by utilizing, for example, a sputtering method, a photolithography technique, and an etching technique. In the third step, the second layer 612 of the first conductive portion 61 and the third layer 623 of the second conductive portion 62 are formed using, for example, a sputtering method, an evaporation method, or a printing method.

In the fabrication method of the radio frequency module 100 according to the modified example 5, the second conductive portion 62 can be formed without necessarily using laser beam irradiation. Thus, in the case where the second conductive portion 62 is in contact with part of the upper surface 15 of the first electronic component 1 and part of the upper surface 25 of the second electronic component 2, the fabrication method of the radio frequency module 100 according to the modified example 5 has the effect that the first electronic component 1 and the second electronic component 2 are not affected by heat from the laser beam.

The radio frequency module 100 according to the modified example 5 can make the thickness of the first conductive portion 61 thinner, compared with the radio frequency module 100 according to the embodiment 1. Because of this, in the radio frequency module 100 according to the modified example 5, the resistance of the first conductive portion 61 can be increased in the direction along which the first RF terminal 11 and the second RF terminal 21 are lined up in the plan view seen from the thickness direction D1 of the mounting board 9, and thus it becomes possible to improve the isolation.

(3.6) Modified Example 6

Figure 10:
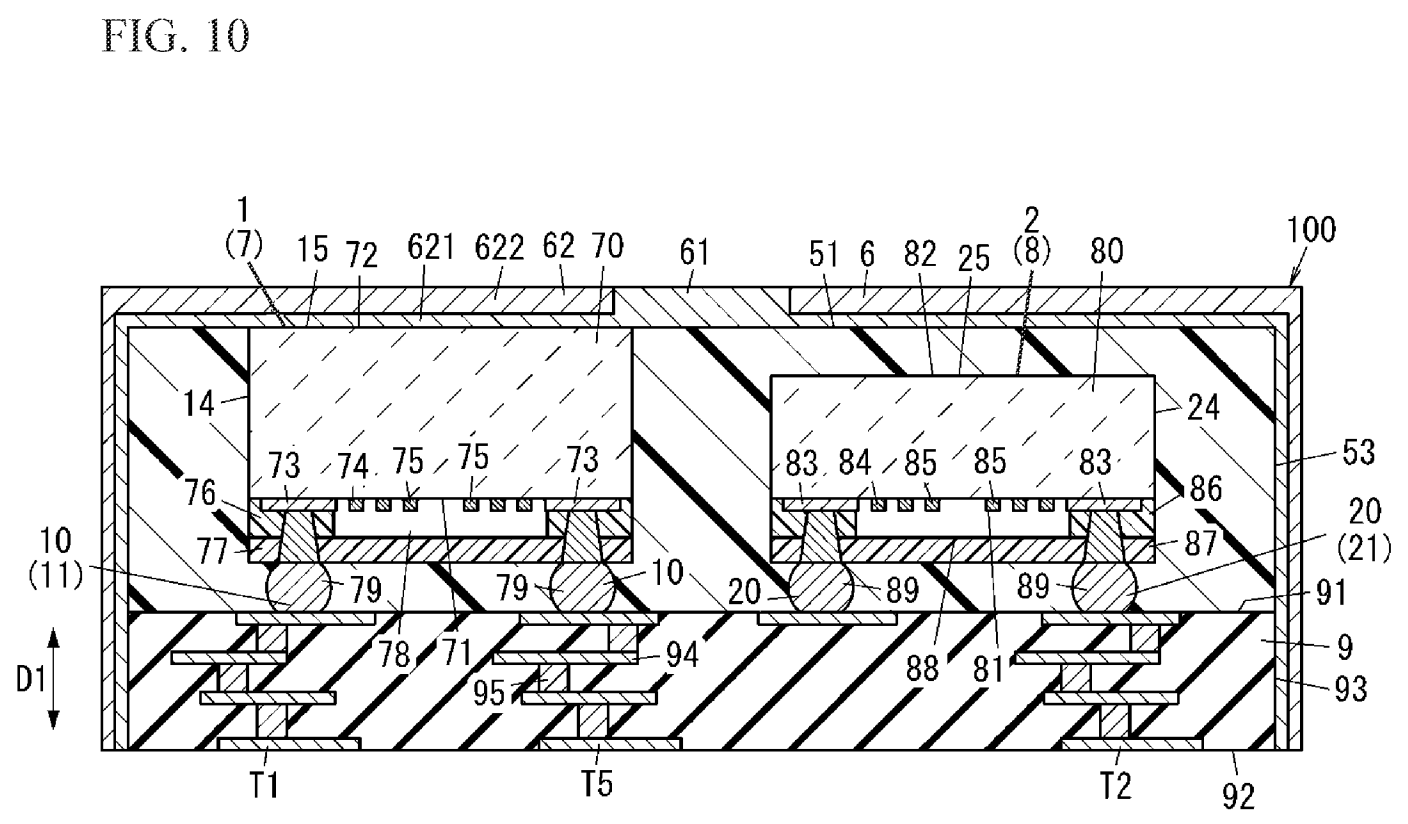

A radio frequency module 100 according to a modified example 6 of the embodiment 1 is described with reference to FIG. 10. With regard to the radio frequency module 100 according to the modified example 6, the same reference characters denote constituent elements similar to those of the radio frequency module 100 according to the modified example 5 of the embodiment 1, and the descriptions thereof are omitted.

The radio frequency module 100 according to the modified example 6 is different from the radio frequency module 100 according to the modified example 5 in that the upper surface 25 of the second electronic component 2 is not in contact with the conductive layer 6.

Further, the radio frequency module 100 according to the modified example 6 is different from the radio frequency module 100 according to the modified example 5 in that the first conductive portion 61 has a single layer structure instead of a multilayer structure.

In the radio frequency module 100 according to the modified example 6, the second conductive portion 62 has a two-layer structure of a first layer 621 and a second layer 622. The material of the first layer 621 is, for example, Ti. The material of the second layer 622 is, for example, Au. The first conductive portion 61 and the first layer 621 of the second conductive portion 62 are the same in their materials, and that material is, for example, Ti.

In the radio frequency module 100 according to the modified example 6, the upper surface 25 of the second electronic component 2, which is made up of the receive filter 8, is not in contact with the conductive layer 6, and thus, it becomes possible to suppress the heat transfer of the heat generated in the first electronic component 1, which is made up of the transmit filter 7, to the second electronic component 2 via the conductive layer 6.

(3.7) Modified Example 7

Figure 11:
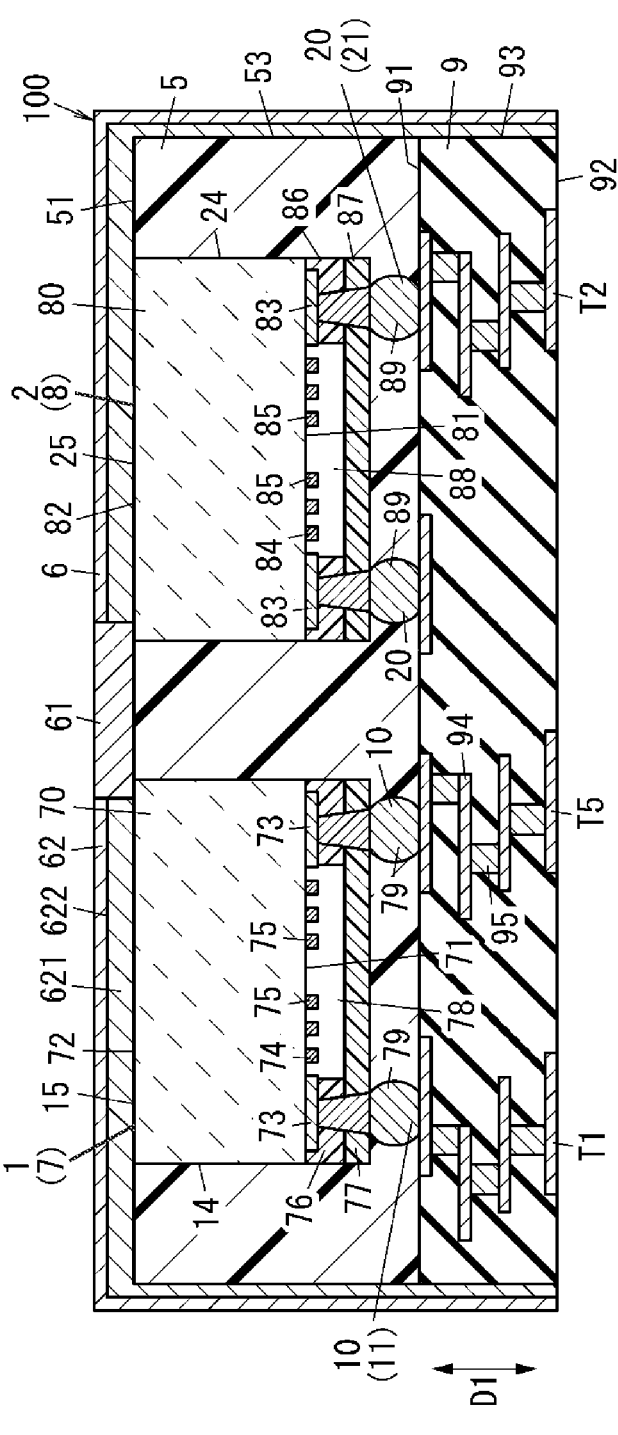
FIG. 11 is a sectional view of a radio frequency module according to a modified example 7 of the embodiment 1.

A radio frequency module 100 according to a modified example 7 of the embodiment 1 is described with reference to FIG. 11. With regard to the radio frequency module 100 according to the modified example 7, the same reference characters denote constituent elements similar to those of the radio frequency module 100 according to the modified example 5 of the embodiment 1, and the descriptions thereof are omitted.

The radio frequency module 100 according to the modified example 7 is different from the radio frequency module 100 according to the modified example 5 in that the first conductive portion 61 is composed of an alloy of the metal material of the first layer 621 of the second conductive portion 62 and the second metal material of the second conductive portion 62. Further, the radio frequency module 100 according to the modified example 7 is different from the radio frequency module 100 according to the modified example 5 in that the first conductive portion 61 has a single layer structure instead of a multilayer structure.

(3.8) Modified Example 8

Figure 12:
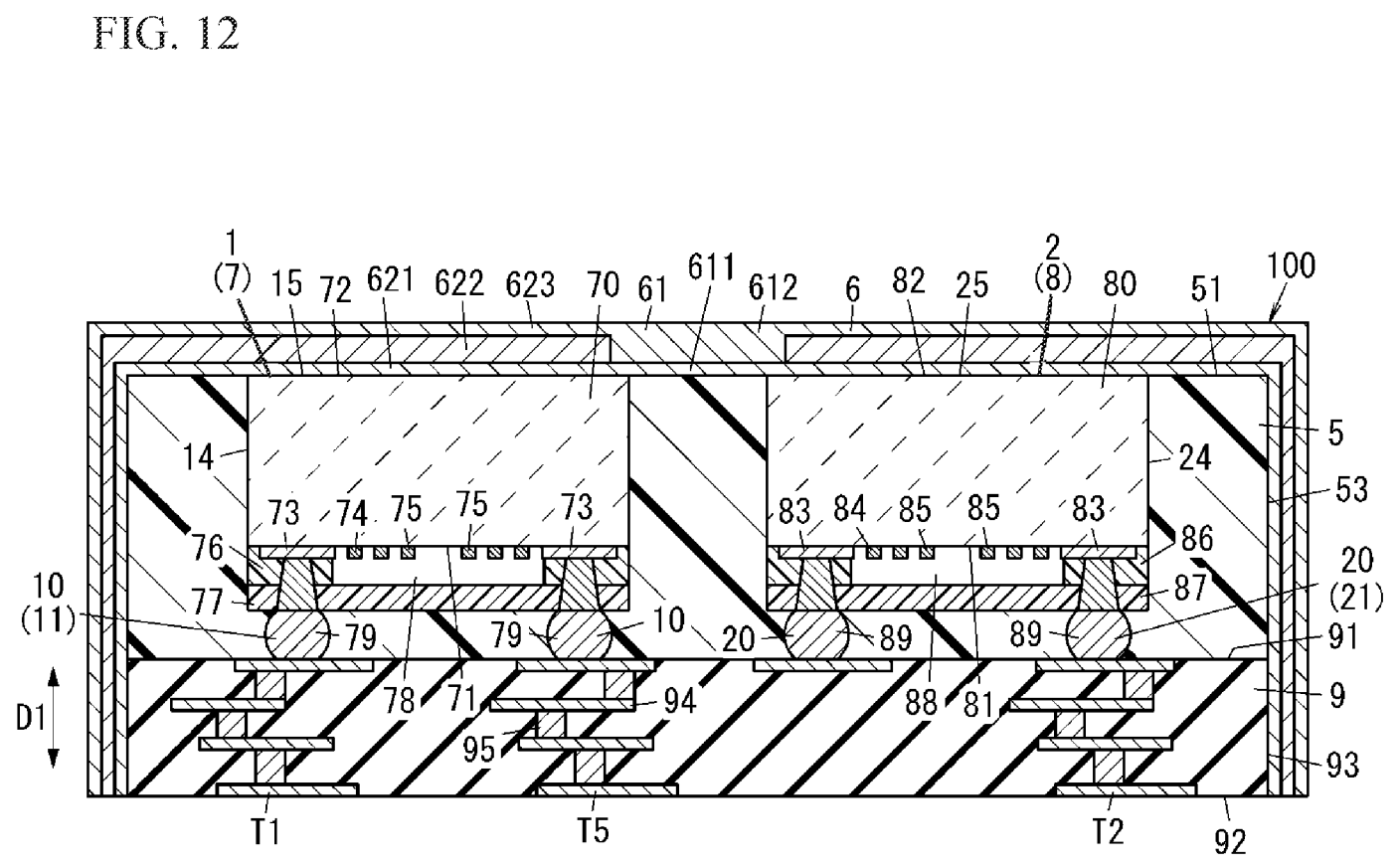

A radio frequency module 100 according to a modified example 8 of the embodiment 1 is described with reference to FIG. 12. With regard to the radio frequency module 100 according to the modified example 8, the same reference characters denote constituent elements similar to those of the radio frequency module 100 according to the modified example 5 (see FIG. 9) of the embodiment 1, and the descriptions thereof are omitted.

In the radio frequency module 100 according to the modified example 8, as is the case with the radio frequency module 100 according to the modified example 5, the first conductive portion 61 has a multilayer structure of the first layer 611 composed of the same material as the first layer 621 of the second conductive portion 62 (for example, SUS) and the second layer 612 composed of the same material as the third layer 623 of the second conductive portion 62 (for example, SUS). In the radio frequency module 100 according to the modified example 8 is different from the radio frequency module 100 according to the modified example 5 in that the thickness of the second layer 612 of the first conductive portion 61 is equal to the total thickness of the second layer 622 and the third layer 623 of the second conductive portion 62.

Embodiment 2

Figure 13:
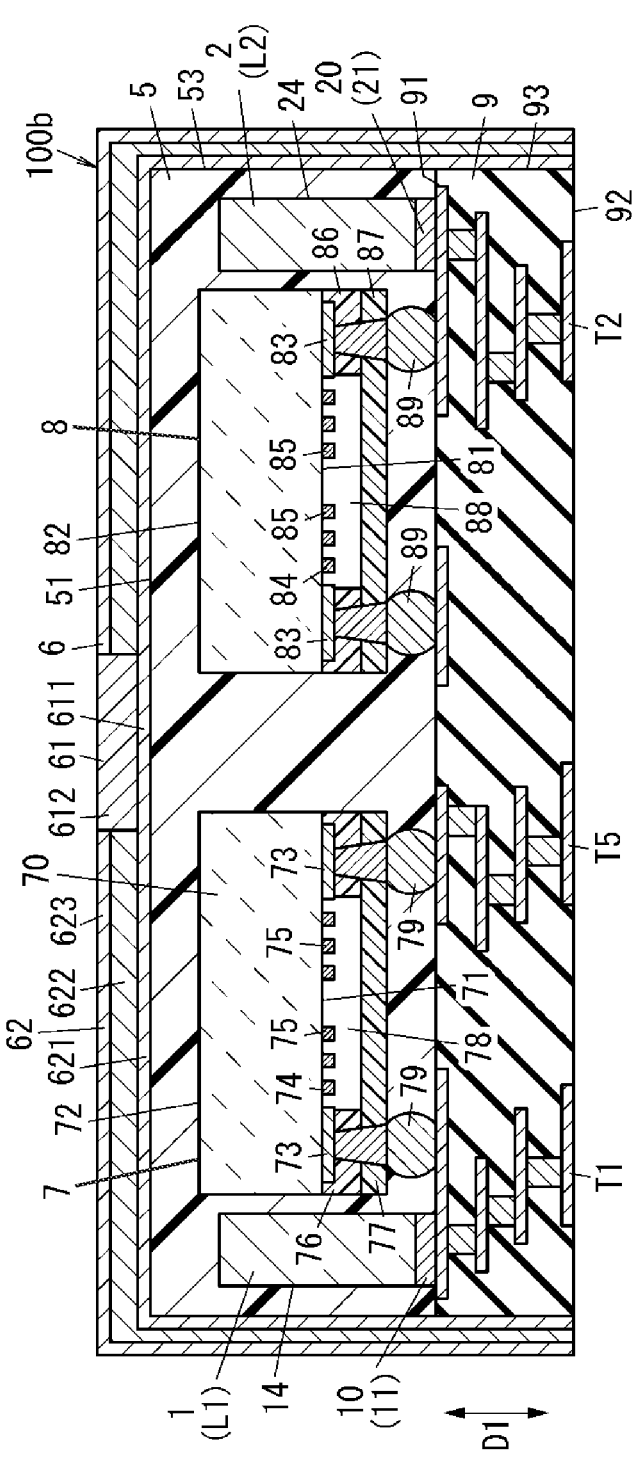
FIG. 13 is a sectional view of a radio frequency module according to an embodiment 2.

Next, a radio frequency module 100*b* according to an embodiment 2 is described with reference to FIG. 13 and FIG. 14. With regard to the radio frequency module 100*b* according to the embodiment 2, the same reference characters denote constituent elements similar to those of the radio frequency module 100 according to the embodiment 1, and the descriptions thereof are omitted.

Figure 14:
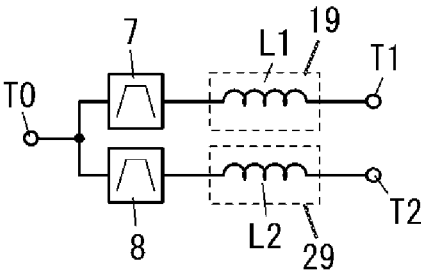
FIG. 14 is a circuit diagram of the foregoing radio frequency module.

The radio frequency module 100*b* according to the embodiment 2 is different from the radio frequency module 100 according to the embodiment 1 in including a first matching element 19 connected between the transmit filter 7 and the transmit terminal T1 and a second matching element 29 connected between the receive filter 8 and the receive terminal T2, as illustrated in FIG. 14. The first matching element 19 is, for example, a first inductor L1. The second matching element 29 is, for example, a second inductor L2.

In the radio frequency module 100*b*, the first inductor L1 is a first surface mount type electronic component and makes up the first electronic component 1. Further, the second inductor L2 is a second surface mount type electronic component and makes up the second electronic component 2. The first inductor L1 includes two units of the first external terminals 10, and these two first external terminals 10 make up the first RF terminals 11 of the first electronic component 1. The second inductor L2 includes two units of the second external terminals 20, and these two second external terminals 20 make up the second RF terminals 21 of the second electronic component 2.

In the radio frequency module 100b, the first inductor L1 is adjacent to the transmit filter 7 in the plan view seen from the thickness direction D1 of the mounting board 9. "The first inductor L1 is adjacent to the transmit filter 7" is defined to mean that in the plan view seen from the thickness direction D1 of the mounting board 9, no other circuit component is present between the first inductor L1 and the transmit filter 7, and the first inductor L1 and the transmit filter 7 are arranged next to each other. Further, in the radio frequency module 100b, the second inductor L2 is adjacent to the receive filter 8 in the plan view seen from the thickness direction D1 of the mounting board 9. "The second inductor L2 is adjacent to the receive filter 8" is defined to mean that in the plan view seen from the thickness direction D1 of the mounting board 9, no other circuit component is present between the second inductor L2 and the receive filter 8, and the second inductor L2 and the receive filter 8 are arranged next to each other.

In the radio frequency module 100b, in the plan view seen from the thickness direction D1 of the mounting board 9, the first inductor L1, the transmit filter 7, the receive filter 8, and the second inductor L2 are arranged in the order of the first inductor L1, the transmit filter 7, the receive filter 8, and the second inductor L2 from the first inductor L1 side in the direction along which the first inductor L1 and the second inductor L2 are lined up.

In the radio frequency module 100b, the first conductive portion 61 has a multilayer structure of a first layer 611 and a second layer 612. The material of the first layer 611 of the first conductive portion 61 is the same as the material of the first layer 621 of the second conductive portion 62. The second layer 612 of the first conductive portion 61 is an alloy of the material of the second layer 622 of the second conductive portion 62 and the material of the third layer 623 of the second conductive portion 62.

In the radio frequency module 100b, it becomes possible to improve the isolation between the first RF terminal 11 of the first electronic component 1, which is made up of the first inductor L1, and the second RF terminal 21 of the second electronic component 2, which is made up of the second inductor L2. Further, in the radio frequency module 100b, it becomes possible to improve the isolation between the external terminal 79 of the transmit filter 7 and the external terminal 89 of the receive filter 8.

Embodiment 3

Figure 15:
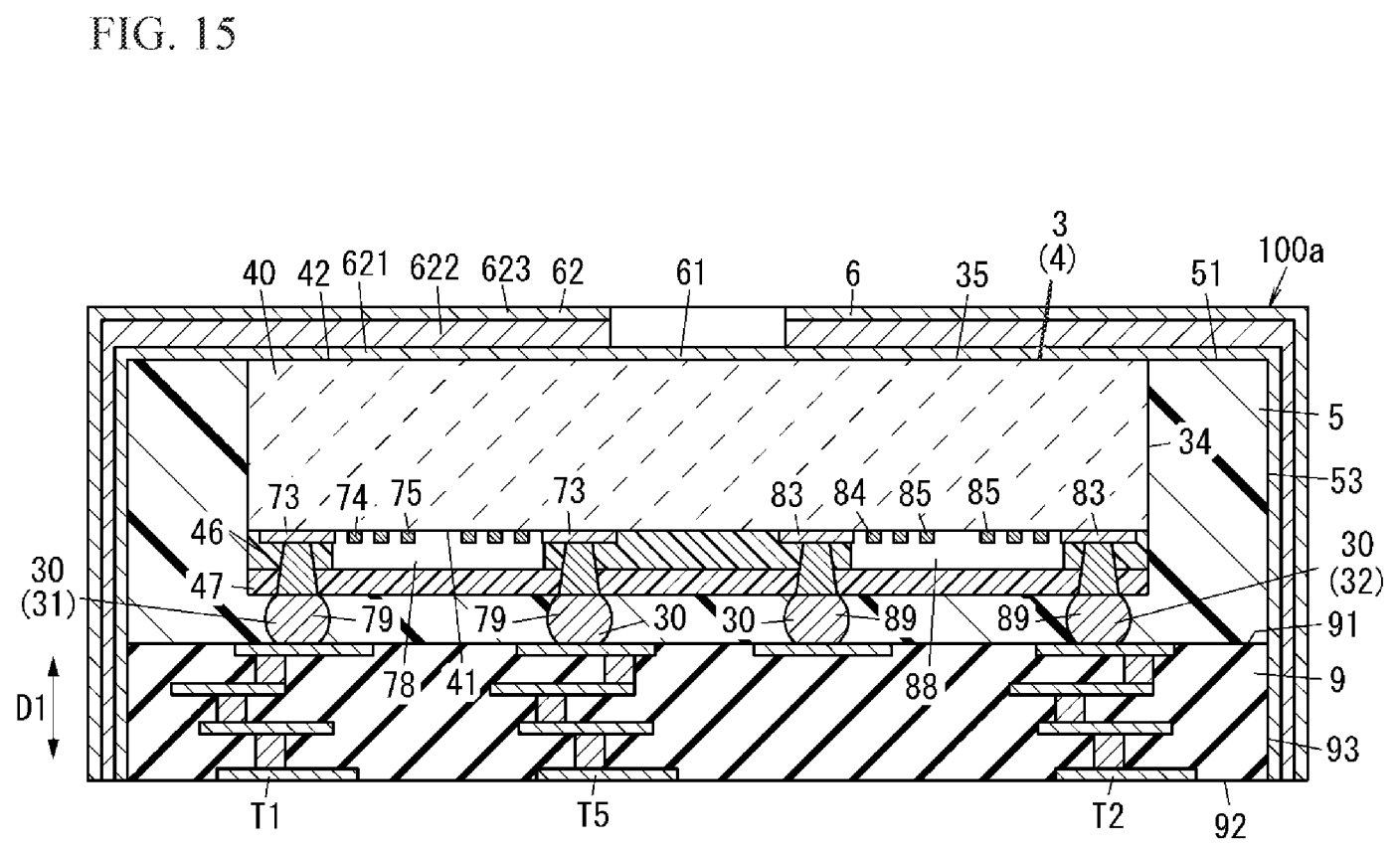
Figure 16:
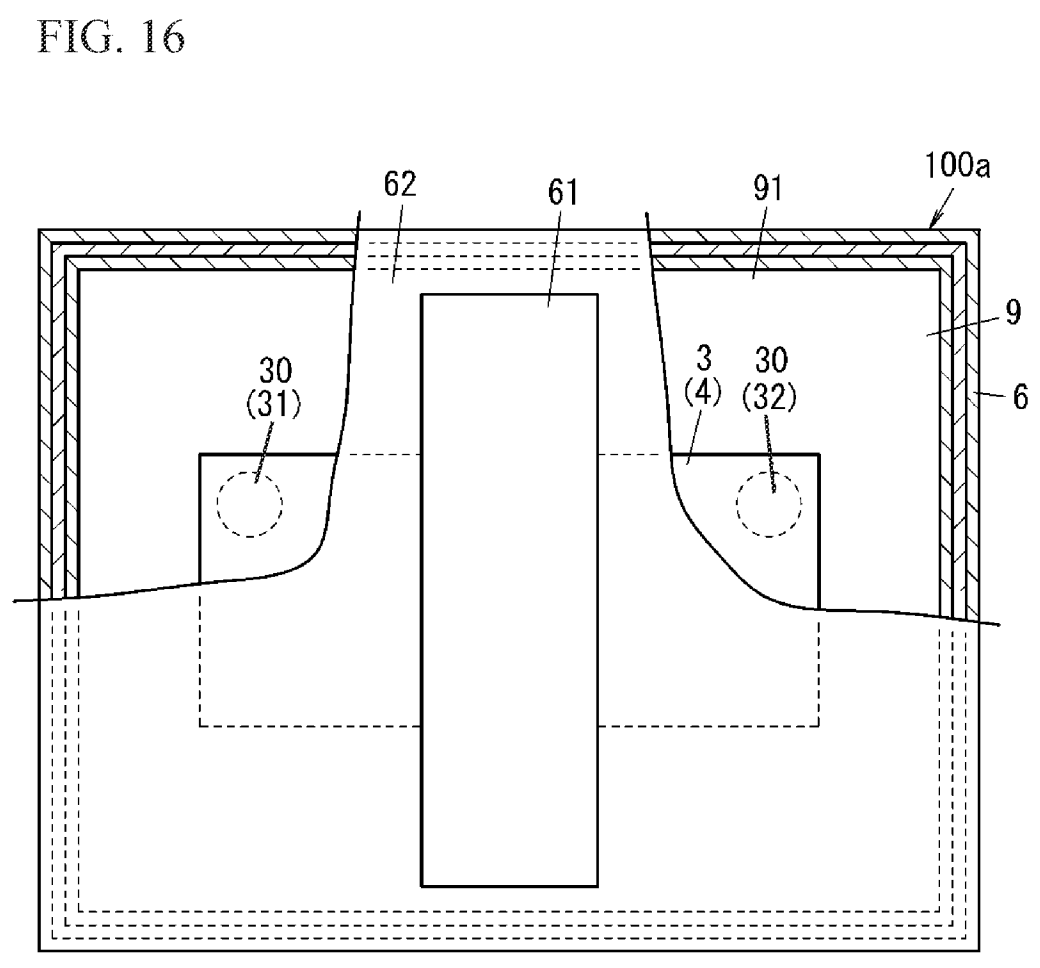

A radio frequency module 100a according to an embodiment 3 is described with reference to FIG. 15 and FIG. 16. With regard to the radio frequency module 100a according to the embodiment 3, the same reference characters denote constituent elements similar to those of the radio frequency module 100 according to the modified example 5 of the embodiment 1 (see FIG. 9), and the descriptions thereof are omitted.

The radio frequency module 100a according to the embodiment 3 is different from the radio frequency module 100 according to the modified example 5 in that a duplexer 4 is configured in such a way that the board 70 of the transmit filter 7 and the board 80 of the receive filter 8 of the radio frequency module 100 according to the modified example 5 of the embodiment 1 are integrated as a common board 40. The board 40 has a first principal surface 41 and a second principal surface 42, which face each other in a thickness direction of the board 40. In place of the first principal surface 71 of the board 70 and the first principal surface 81 of the board 80, the radio frequency module 100a according to the embodiment 3 has the first principal surface 41 of the board 40. In the radio frequency module 100a according to the embodiment 3, the duplexer 4 makes up an electronic component 3 mounted on the principal surface 91 of the mounting board 9. The electronic component 3 includes a plurality of external terminals 30. The plurality of external terminals 30 includes a first RF terminal 31 and a second RF terminal 32. The first RF terminal 31 is made up of the external terminal 79. The second RF terminal 32 is made up of the external terminal 89. The conductive layer 6 is in contact with an upper surface 35 of the electronic component 3.

The radio frequency module 100a according to the embodiment 3 includes the mounting board 9, the electronic component 3, the resin layer 5, and the conductive layer 6. The mounting board 9 has the principal surface 91. The electronic component 3 includes the plurality of external terminals 30. The electronic component 3 is mounted on the principal surface 91 of the mounting board 9 using the plurality of external terminals 30. The resin layer 5 is arranged on the principal surface 91 of the mounting board 9 and covers at least an outer perimeter surface 34 of the electronic component 3. The conductive layer 6 covers the resin layer 5 and overlaps the electronic component 3 in the plan view seen from the thickness direction D1 of the mounting board 9. The plurality of external terminals 30 of the electronic component 3 includes the first RF terminal 31 and the second RF terminal 32. The conductive layer 6 includes the first conductive portion 61 and the second conductive portion 62. The first conductive portion 61 is positioned in between the first RF terminal 31 and the second RF terminal 32 in the plan view seen from the thickness direction D1 of the mounting board 9. The second conductive portion 62 is adjacent to the first conductive portion 61 in the plan view seen from the thickness direction D1 of the mounting board 9. The resistivity of the first conductive portion 61 is higher than the resistivity of the second conductive portion 62. Further, in the radio frequency module 100a according to the embodiment 3, the first conductive portion 61 has a single layer structure and has the same thickness as the first layer 621 of the second conductive portion 62, and the material of the first conductive portion 61 is the same as the material of the first layer 621 of the second conductive portion 62.

The radio frequency module 100a according to the embodiment 3 enables the improvement of isolation. Here, the radio frequency module 100a according to the embodiment 3 enables the improvement of the isolation between the first RF terminal 31 and the second RF terminal 32 of the electronic component 3.

Embodiment 4

Figure 17:
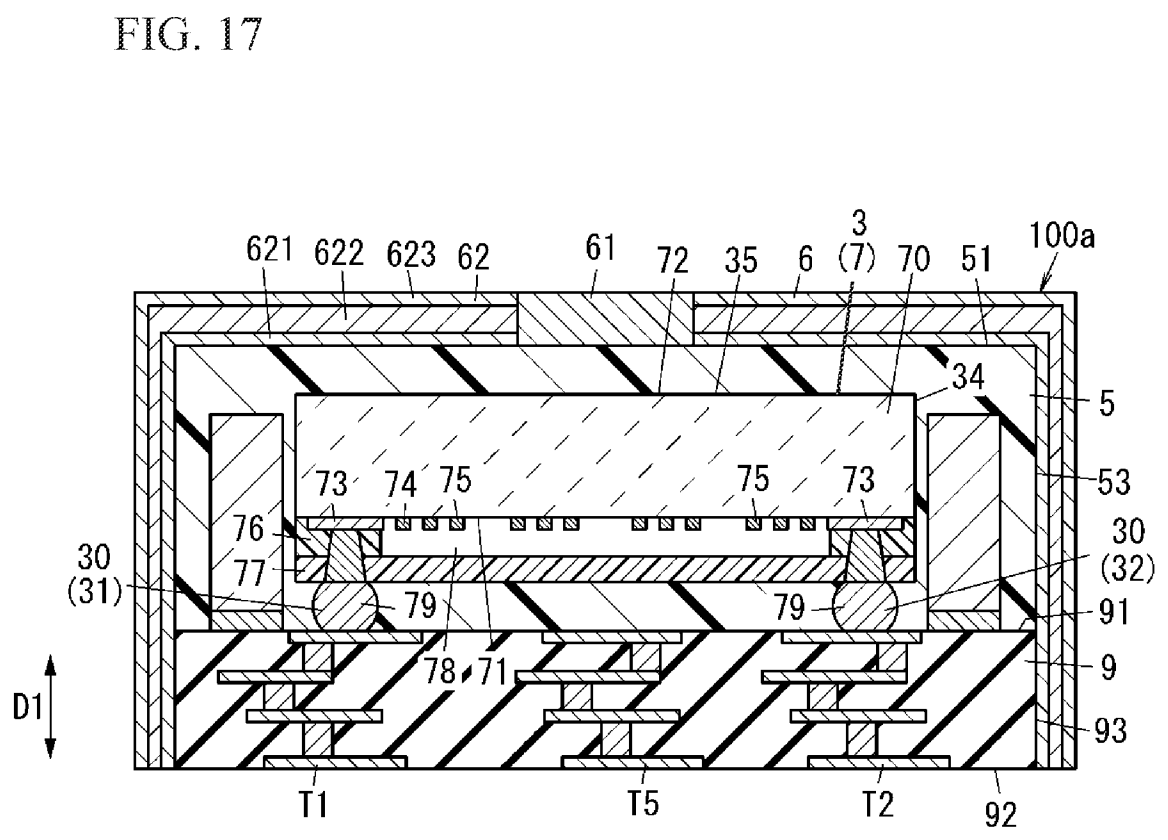

A radio frequency module 100a according to an embodiment 4 is described with reference to FIG. 17. With regard to the radio frequency module 100a according to the embodiment 4, the same reference characters denote constituent elements similar to those of the radio frequency module 100a according to the embodiment 3, and the descriptions thereof are omitted.

In the radio frequency module 100*a* according to the embodiment 4 is different from the radio frequency module 100*a* according to the embodiment 3 in that the electronic component 3 is made up of the transmit filter 7. In the electronic component 3, each of the first RF terminal 31 and the second RF terminal 32 is made up of the external terminal 79. The transmit filter 7 that makes up the electronic component 3 is a wideband filter whose pass band includes a plurality of communication bands.

The radio frequency module 100*a* according to the embodiment 4 enables the improvement of isolation. Here, the radio frequency module 100*a* according to the embodiment 3 enables the improvement of the isolation between the first RF terminal 31 and the second RF terminal 32 of the electronic component 3.

Modified Example 1 of Embodiment 4

Figure 18:
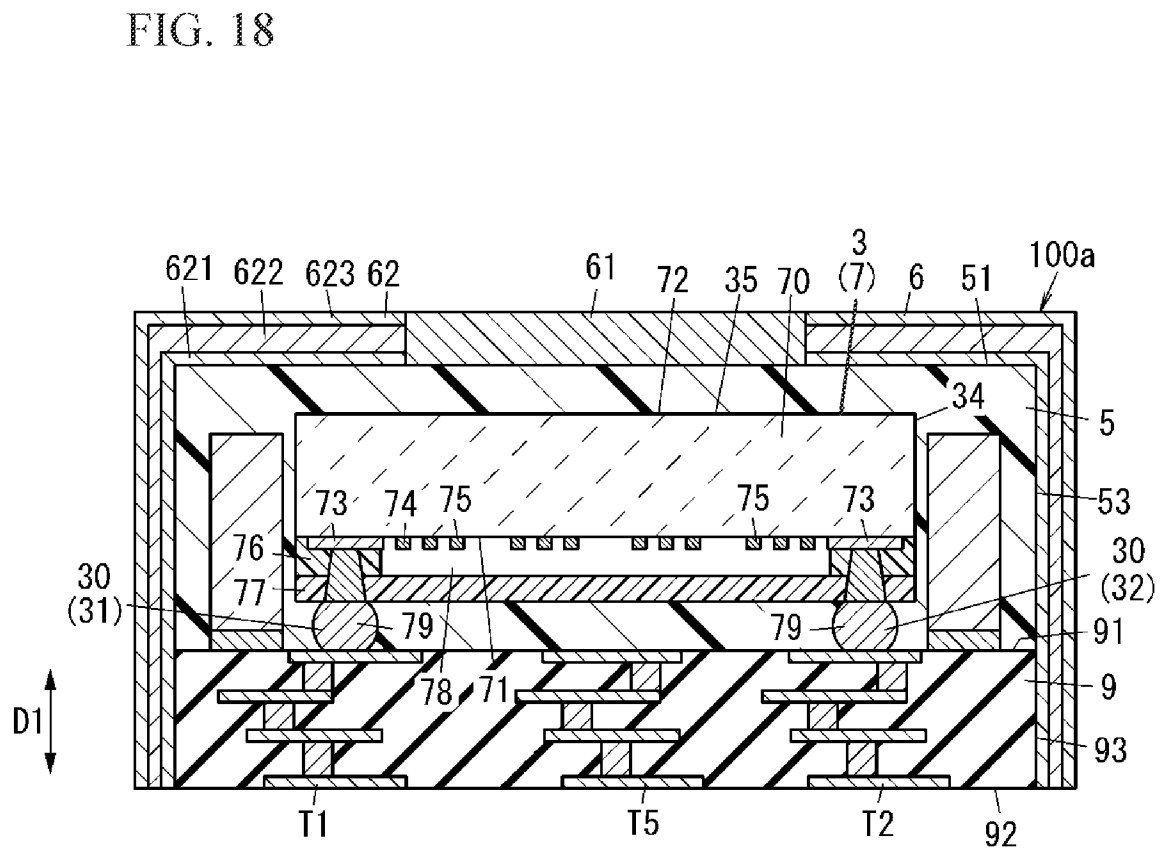

A radio frequency module 100*a* according to a modified example 1 of the embodiment 4 is described with reference to FIG. 18. With regard to the radio frequency module 100*a* according to the modified example 1 of the embodiment 4, the same reference characters denote constituent elements similar to those of the radio frequency module 100*a* according to the embodiment 4, and the descriptions thereof are omitted.

In the radio frequency module 100*a* according to the modified example 1 of the embodiment 4, in the plan view seen from the thickness direction D1 of the mounting board 9, the length of the first conductive portion 61 in the direction along which the first RF terminal 31 and the second RF terminal 32 are lined up is longer than the corresponding length of the first conductive portion 61 of the radio frequency module 100*a* according to the embodiment 4. Because of this, the radio frequency module 100*a* according to the modified example 1 of the embodiment 4 can make the resistance of the first conductive portion 61 greater, compared with the radio frequency module 100*a* according to the embodiment 4. Accordingly, the radio frequency module 100*a* according to the modified example 1 of the embodiment 4 enables further improvement of the isolation between the first RF terminal 31 and the second RF terminal 32 of the electronic component 3.

Modified Example 2 of Embodiment 4

Figure 19:
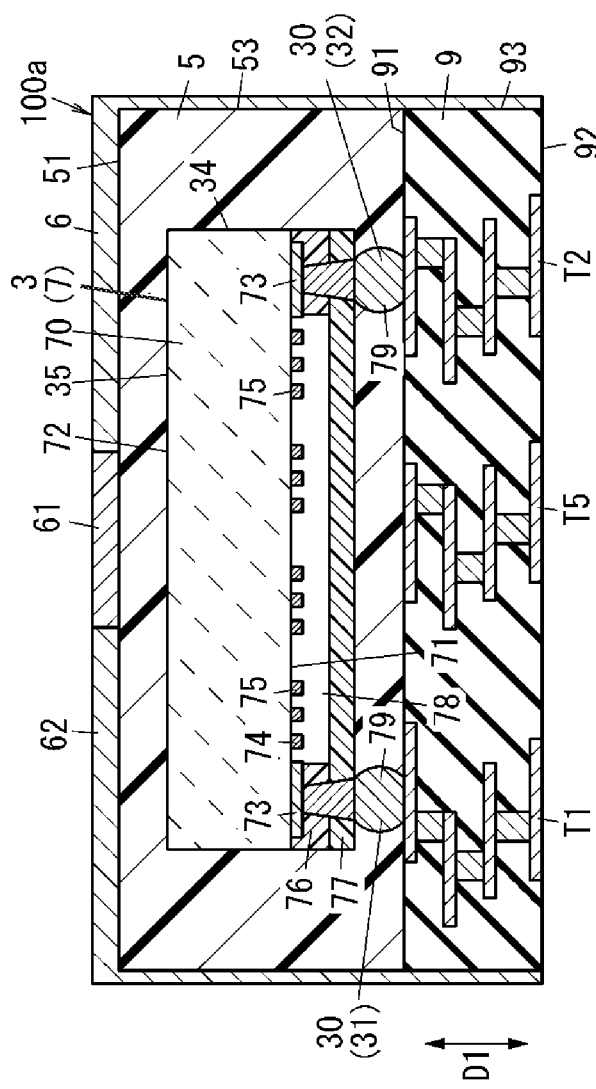
FIG. 19 is a sectional view of a radio frequency module according to a modified example 2 of the embodiment 4.

A radio frequency module 100*a* according to a modified example 2 of the embodiment 4 is described with reference to FIG. 19. With regard to the radio frequency module 100*a* according to the modified example 2 of the embodiment 4, the same reference characters denote constituent elements similar to those of the radio frequency module 100*a* according to the embodiment 4, and the descriptions thereof are omitted.

In the radio frequency module 100*a* according to the modified example 2, the material of the first conductive portion 61 is, for example, SUS. The material of the first conductive portion 61 is not limited to SUS and may alternatively be, for example, T1, Ni, or iron oxide. The structure of the first conductive portion 61 is not limited to a single layer structure and may alternatively be a multilayer structure such as, for example, a multilayer structure of a SUS layer and a Ni layer, or a multilayer structure of a T1 layer and a Ni layer. The second conductive portion 62 may have a single layer structure formed of a material whose resistivity is lower than that of the first conductive portion 61, or may have a multilayer structure of the first layer 621, the second layer 622, and the third layer 623, as is the case with the radio frequency module 100*a* according to the embodiment 4 (see FIG. 17).

Next, a first process to a sixth process of a fabrication method of the radio frequency module 100*a* according to the modified example 2 are described with reference to FIG. 21A to FIG. 22C.

Figure 20A:
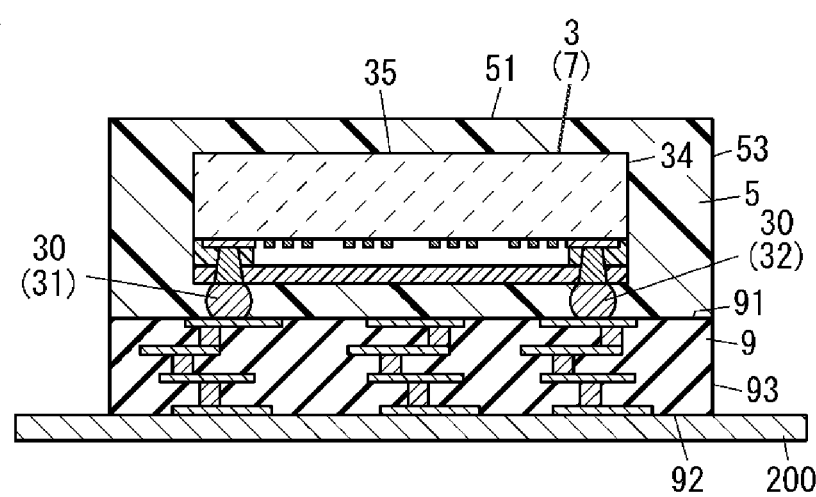
FIGS. 20A to 20C are sectional views of suitable processes for illustrating a fabrication method of the forgoing radio frequency module.

In the first process, the resin layer 5 is formed after mounting the electronic component 3 on the principal surface 91 of the mounting board 9, and subsequently, the mounting board 9 is arranged on a support board 200 (see FIG. 20A).

Figure 20B:
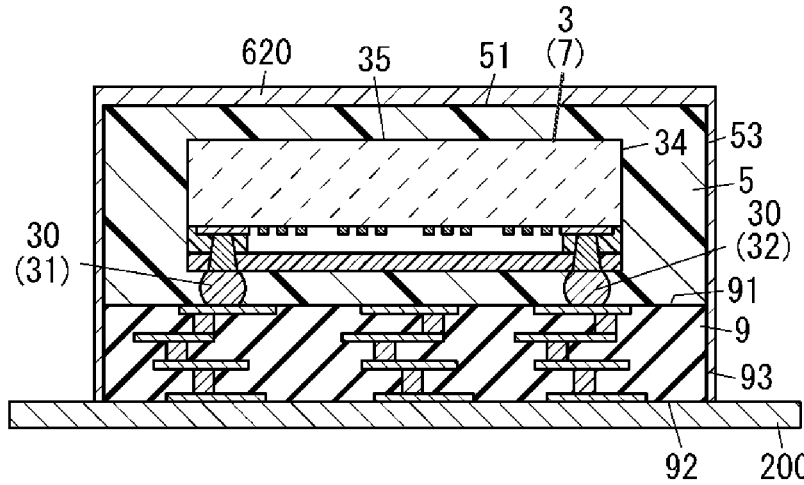

In the second process, a conductive film 620 that later becomes the second conductive portion 62 is formed using a sputtering method in such a manner as to cover the principal surface 51 of the resin layer 5, the outer perimeter surface 53 of the resin layer 5, and the outer perimeter surface 93 of the mounting board 9 (see FIG. 20B).

Figure 20C:
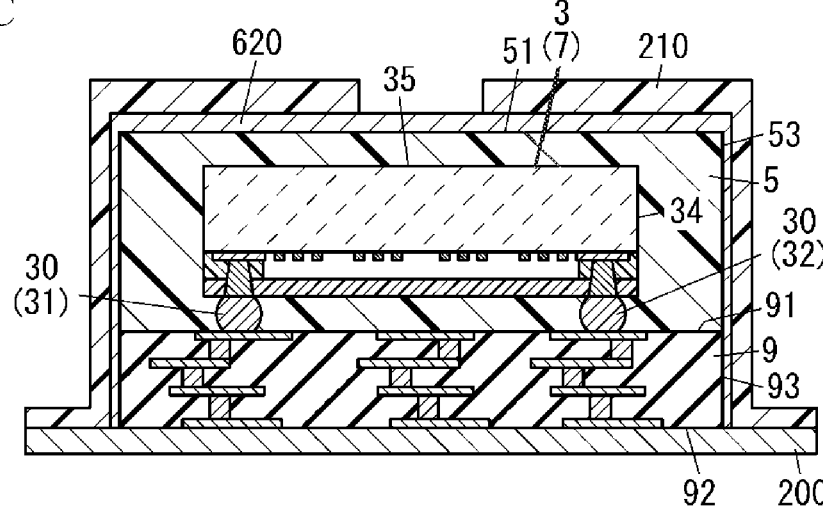

In the third process, a resist layer 210 is formed on the conductive film 620 by utilizing a photolithography technique, and the resist layer 210 has an opening that exposes part of the conductive film 620, where the first conductive portion 61 is to be formed (see FIG. 20C).

Figures 21A, 21B, 21C:
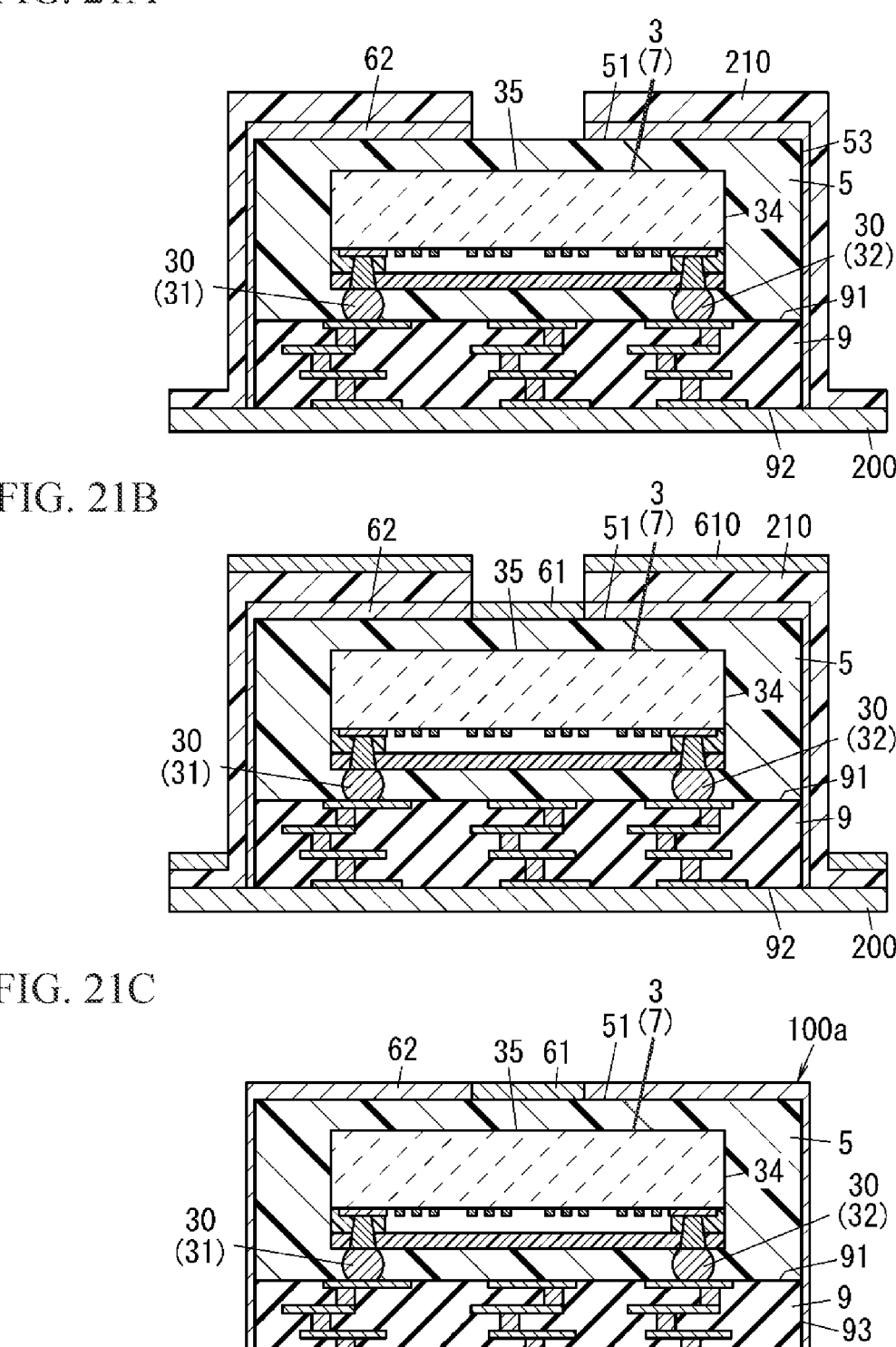
FIGS. 21A to 21C are sectional views of suitable processes for illustrating a fabrication method of the forgoing radio frequency module.

In the fourth process, by using the resist layer 210 as a mask, the part of the conductive film 620 is removed by etching to expose part of the principal surface 51 of the resin layer 5 (see FIG. 21A). Because of this, the second conductive portion 62, which is made up of the part of the conductive film 620 remained on the resin layer 5, is formed.

In the fifth process, the first conductive portion 61 is formed using an evaporation method or the like (see FIG. 21B). In the fifth process, an unwanted film 610 composed of the same material as the first conductive portion 61 is formed on the resist layer 210.

In the sixth process, the resist layer 210 and the unwanted film 610 are removed (see FIG. 21C). This completes the formation of the radio frequency module 100*a*. Subsequently, the radio frequency module 100*a* may be separated from the support board 200.

Other Modified Examples

The forgoing embodiments 1 to 4 and the like are some of various embodiments of the present disclosure. The forgoing embodiments 1 to 4 and the like can be modified in various ways according to the design of the present disclosure, and if appropriate, different constituent elements of different embodiments may be combined.

For example, the radio frequency module 100 according to the embodiment 1 may further include a metal member (for example, a metal wall) that is arranged on the first principal surface 91 of the mounting board 9, positioned in between the first electronic component 1 and the second electronic component 2, and connected to the ground layer of the mounting board 9.

Each of the transmit filter 7 and the receive filter 8 may have, as the board, a piezoelectric board having a multilayer structure of a silicon board, a low acoustic velocity film, and a piezoelectric layer. The material of the piezoelectric layer is, for example, lithium niobate or lithium tantalate. The low acoustic velocity film is a film such that the acoustic velocity of a bulk wave propagating through the low acoustic velocity film is lower than the acoustic velocity of a bulk wave propagating through the piezoelectric layer. The material of the low acoustic velocity film is, for example, silicon oxide. However, the material of the low acoustic velocity film is not limited to silicon oxide. In the silicon board, the acoustic velocity of a bulk wave propagating through the silicon board is higher than the acoustic velocity of an acoustic wave propagating through the piezoelectric layer. Here, the bulk wave propagating through the silicon board is a bulk wave having the lowest acoustic velocity among a plurality of bulk waves propagating through the silicon board.

Further, the piezoelectric board may further include, for example, a high acoustic velocity film that is provided between the silicon board and the low acoustic velocity film. The high acoustic velocity film is a film such that the acoustic velocity of a bulk wave propagating through the high acoustic velocity film is higher than the acoustic velocity of an acoustic wave propagating through the piezoelectric layer. The material of the high acoustic velocity film is, for example, silicon nitride. However, the material of the high acoustic velocity film is not limited to silicon nitride and may include at least one kind of material selected from a group consisting of diamond-like carbon, aluminum nitride, silicon carbide, silicon nitride, silicon oxynitride, silicon, sapphire, lithium tantalate, lithium niobate, crystal, zirconia, cordierite, mullite, steatite, forsterite, magnesia, and diamond.

The thickness of the piezoelectric layer is, for example, less than or equal to $3.5\lambda$ where $\lambda$ is the wavelength of an acoustic wave, which is determined based on the electrode finger period of the IDT electrode. The thickness of the low acoustic velocity film is, for example, less than or equal to $2.0\lambda$.

Further, each of the transmit filter 7 and the receive filter 8 is not limited to the surface acoustic wave filter and may alternatively be, for example, a BAW (Bulk Acoustic Wave) filter. A resonator in the BAW filter is, for example, a FBAR (Film Bulk Acoustic Resonator) or a SMR (Solidly Mounted Resonator). The BAW filter includes a board. The board is, for example, a silicon board.

Further, each of the transmit filter 7 and the receive filter 8 is not limited to the ladder filter and may alternatively be, for example, a longitudinally coupled resonator type surface acoustic wave filter.

Further, all of the acoustic wave filters described above are acoustic wave filters that utilize a surface acoustic wave or a bulk acoustic wave, but are not limited thereto. Alternatively, for example, the foregoing acoustic wave filter may be an acoustic wave filter that utilizes a boundary acoustic wave, a plate wave, or the like.

The circuit configuration of the radio frequency modules 100 to 100b are not limited to the examples described above. The radio frequency module 100 may alternatively be, for example, a module compatible with carrier aggregation and dual connectivity. Further, the radio frequency modules 100 to 100b may include, for example, as a circuit constituent, a front-end circuit compatible with MIMO (Multi Input Multi Output).

Further, instead of the radio frequency module 100, the communication device 300 according to the embodiment 1 may include one of the radio frequency modules 100a and 100b.

Aspects

In the present specification, the following aspects are disclosed.

A radio frequency module (100;100b) according to a first aspect includes the mounting board (9), a first electronic component (1), a second electronic component (2), a resin layer (5), and a conductive layer (6). The mounting board (9) has a principal surface (91). The first electronic component (1) includes a plurality of first external terminals (10) including a first RF terminal (11). The first electronic component (1) is mounted on the principal surface (91) of the mounting board (9) using the plurality of first external terminals (10). The second electronic component (2) includes a plurality of second external terminals (20) including a second RF terminal (21). The second electronic component (2) is mounted on the principal surface (91) of the mounting board (9) using the plurality of second external terminals (20). The resin layer (5) is arranged on the principal surface (91) of the mounting board (9) and covers at least an outer perimeter surface (14) of the first electronic component (1) and an outer perimeter surface (24) of the second electronic component (2). The conductive layer (6) covers the resin layer (5) and overlaps the first electronic component (1) and the second electronic component (2) in a plan view seen from a thickness direction (D1) of the mounting board (9). The conductive layer (6) includes a first conductive portion (61) and a second conductive portion (62). The first conductive portion (61) is positioned in between the first RF terminal (11) and the second RF terminal (21) in the plan view seen from the thickness direction (D1) of the mounting board (9). The second conductive portion (62) is adjacent to the first conductive portion (61) in the plan view seen from the thickness direction (D1) of the mounting board (9). The resistivity of the first conductive portion (61) is higher than the resistivity of the second conductive portion (62).

The radio frequency module (100;100b) according to the first aspect enables the improvement of isolation.

A radio frequency module (100a) according to a second aspect includes a mounting board (9), an electronic component (3), a resin layer (5), and a conductive layer (6). The mounting board (9) has a principal surface (91). The electronic component (3) includes a plurality of external terminals (30). The electronic component (3) is mounted on the principal surface (91) of the mounting board (9) using the plurality of external terminals (30). The resin layer (5) is arranged on the principal surface (91) of the mounting board (9) and covers at least an outer perimeter surface (34) of the electronic component (3). The conductive layer (6) covers the resin layer (5) and overlaps the electronic component (3) in a plan view seen from a thickness direction (D1) of the mounting board (9). The plurality of external terminals (30) of the electronic component (3) includes a first RF terminal (31) and a second RF terminal (32). The conductive layer (6) includes a first conductive portion (61) and a second conductive portion (62). The first conductive portion (61) is positioned in between the first RF terminal (31) and the second RF terminal (32) in the plan view seen from the thickness direction (D1) of the mounting board (9). The second conductive portion (62) is the part other than the first conductive portion (61) in the plan view seen from the thickness direction (D1) of the mounting board (9). The resistivity of the first conductive portion (61) is higher than the resistivity of the second conductive portion (62).

The radio frequency module (100a) according to the second aspect enables the improvement of isolation.

In a radio frequency module (100;100b) according to a third aspect, in the first aspect, the conductive layer (6) is in contact with an upper surface (15) of the first electronic component (1) and an upper surface (25) of the second electronic component (2).

The radio frequency module (100;100b) according to the third aspect enables the reduction of profile height.

In a radio frequency module (100*a*) according to a fourth aspect, in the second aspect, the conductive layer (6) is in contact with an upper surface (35) of the electronic component (3).

In a radio frequency module (100) according to a fifth aspect, in the third aspect, the first electronic component (1) is a transmit system circuit component.

The radio frequency module (100) according to the fifth aspect enables the suppression of temperature rise of the first electronic component (1), the stabilization of temperature characteristics of the first electronic component (1), and the stabilization of characteristics of the radio frequency module (100). Further, the radio frequency module (100) according to the fifth aspect enables the suppression of heat transfer of the heat generated in the first electronic component (1) to the second electronic component (2) via the conductive layer (6).

In a radio frequency module (100) according to a sixth aspect, in the fifth aspect, the first electronic component (1) is the transmit filter (7), and the second electronic component (2) is the receive filter (8).

The radio frequency module (100) according to the sixth aspect enables the improvement of the isolation between the transmit filter (7) and the receive filter (8).

In a radio frequency module (100) according to a seventh aspect, in the sixth aspect, each of the first electronic component (1) and the second electronic component (2) is an acoustic wave filter.

A radio frequency module (100*b*) according to an eighth aspect further includes the transmit filter (7) and the receive filter (8) in the first aspect. The first electronic component (1) is the first surface mount type electronic component (first inductor L1) connected to the transmit filter (7), and the second electronic component (2) is the second surface mount type electronic component (second inductor L2) connected to the receive filter (8).

The radio frequency module (100*b*) according to the eighth aspect enables the improvement of the isolation between the first surface mount type electronic component (first inductor L1) and the second surface mount type electronic component (second inductor L2).

A radio frequency module (100;100*b*) according to a ninth aspect is based on any one of the first, third, and fifth to eighth aspects. In the radio frequency module (100;100*b*) according to the ninth aspect, in the plan view seen from the thickness direction (D1) of the mounting board (9), in the direction orthogonal to the direction along which the first RF terminal (11) and the second RF terminal (21) are lined up, a length (H61) of the first conductive portion (61) is longer than a length (H1) of the first electronic component (1) and a length (H2) of the second electronic component (2).

The radio frequency module (100;100*b*) according to the ninth aspect enables the improvement of isolation.

In a radio frequency module (100*a*) according to a tenth aspect, in the second or fourth aspect, the electronic component (3) is the duplexer (4).

The radio frequency module (100*a*) according to the tenth aspect enables the suppression of degradation of characteristics of the duplexer (4).

In a radio frequency module (100;100*a*;100*b*) according to an eleventh aspect, in any one of the first to tenth aspect, the second conductive portion (62) includes the first SUS layer (first layer 621), the CU layer (second layer 622) on the first SUS layer (first layer 621), and the second SUS layer (third layer 623) on the Cu layer (second layer 622). The resistivity of the first conductive portion (61) is higher than the resistivity of the Cu layer (second layer 622).

The radio frequency module (100;100*a*;100*b*) according to the eleventh aspect enables the improvement of reliability.

In a radio frequency module (100;100*a*;100*b*) according to a twelfth aspect, in any one of the first to tenth aspects, the second conductive portion (62) includes the first T1 layer (first layer 621), the CU layer (second layer 622) on the first T1 layer (first layer 621), and the second T1 layer (third layer 623) on the Cu layer (second layer 622). The resistivity of the first conductive portion (61) is higher than the resistivity of the Cu layer (second layer 622).

The radio frequency module (100;100*a*;100*b*) according to the twelfth aspect enables the improvement of reliability.

A radio frequency module (100:100*b*) according to a thirteenth aspect includes a mounting board (9), a first electronic component (1), a second electronic component (2), a resin layer (5), and a conductive layer (6). The mounting board (9) has a principal surface (91). The first electronic component (1) includes a plurality of first external terminals (10) including a first RF terminal (11). The first electronic component (1) is mounted on the principal surface (91) of the mounting board (9) using the plurality of first external terminals (10). The second electronic component (2) includes a plurality of second external terminals (20) including a second RF terminal (21). The second electronic component (2) is mounted on the principal surface (91) of the mounting board (9) using the plurality of second external terminals (20). The resin layer (5) is arranged on the principal surface (91) of the mounting board (9) and covers at least an outer perimeter surface (14) of the first electronic component (1) and an outer perimeter surface (24) of the second electronic component (2). The conductive layer (6) covers the resin layer (5) and overlaps the first electronic component (1) and the second electronic component (2) in a plan view seen from a thickness direction (D1) of the mounting board (9). The conductive layer (6) includes a first conductive portion (61) and a second conductive portion (62). The first conductive portion (61) is positioned in between the first RF terminal (11) and the second RF terminal (21) in the plan view seen from the thickness direction (D1) of the mounting board (9). The second conductive portion (62) is adjacent to the first conductive portion (61) in the plan view seen from the thickness direction (D1) of the mounting board (9). The second conductive portion (62) includes a first metal layer (62A) including a first metal material and a second metal layer (62B) that is formed on the first metal layer (62A) and includes a second metal material that is different from the first metal material. The first conductive portion (61) includes an alloy portion including the first metal material and the second metal material.

The radio frequency module (100;100*b*) according to the thirteenth aspect enables the improvement of isolation.

In a radio frequency module (100;100*b*) according to a fourteenth aspect, in the thirteenth aspect, the first metal material is Cu, and the second metal material is a material including Fe, Cr, and Ni.

In a radio frequency module (100;110*b*) according to a fifteenth aspect, in the thirteenth aspect, the first metal material is Cu, and the second metal material is T1.

A communication device (300) according to a sixteenth aspect includes the radio frequency module (100;100*a*; 100*b*) according to any one of the first to fifteenth aspects and a signal processing circuit (301). The signal processing circuit (301) is connected to the radio frequency module (100;100*a*;100*b*).

The communication device (300) according to the sixteenth aspect enables the improvement of isolation.

REFERENCE SIGNS LIST

1 First electronic component
10 First external terminal
11 First RF terminal
14 Outer perimeter surface
15 Upper surface
17 Power amplifier
18 Low-noise amplifier
19 First matching element
2 Second electronic component
20 Second external terminal
21 Second RF terminal
24 Outer perimeter surface
25 Upper surface
29 Second matching element
3 Electronic component
4 Duplexer
40 Board
41 First principal surface
42 Second principal surface
5 Resin layer
51 Principal surface
53 Outer perimeter surface
6 Conductive layer
61 First conductive portion
62 Second conductive portion
62A First metal layer
62B Second metal layer
621 First layer (first SUS layer, first T1 layer)
622 Second layer (Cu layer)
623 Third layer (Second SUS layer)
7 Transmit filter (transmit system circuit component)
70 board
71 First principal surface
72 Second principal surface
73 Wiring electrode
74 Circuit portion
75 IDT electrode
76 Spacer layer
77 Cover member
78 First void space
79 External terminal
8 Receive filter
80 Board
81 First principal surface
82 Second principal surface
83 Wiring electrode
84 Circuit portion
85 IDT electrode
86 Spacer layer
87 Cover member
88 Second void space
89 External terminal
9 Mounting board
91 First principal surface
92 Second principal surface
93 Outer perimeter surface
100, 100a, 100b Radio frequency module
300 Communication device
301 Signal processing circuit
302 RF signal processing circuit
303 Baseband signal processing circuit
310 Antenna
D1 Thickness direction
L1 First inductor
L2 Second inductor T0 Antenna terminal
T1 Transmit terminal (signal input terminal)
T2 Receive terminal (signal output terminal)
T5 Ground terminal

The invention claimed is:
1. A radio frequency module comprising:
a mounting board having a principal surface;
a first electronic component comprising a plurality of first external terminals, the plurality of first external terminals comprising a first radio-frequency (RF) terminal, the first electronic component being mounted on the principal surface of the mounting board by the plurality of first external terminals;
a second electronic component comprising a plurality of second external terminals, the plurality of second external terminals comprising a second RF terminal, the second electronic component being mounted on the principal surface of the mounting board by the plurality of second external terminals;
a resin layer on the principal surface of the mounting board, the resin layer covering at least an outer perimeter surface of the first electronic component and an outer perimeter surface of the second electronic component; and
a conductive layer covering the resin layer, the conductive layer overlapping the first electronic component and the second electronic component in a plan view of the mounting board,
wherein the conductive layer comprises:
a first conductive portion between the first RF terminal and the second RF terminal in the plan view; and
a second conductive portion adjacent to the first conductive portion in the plan view, and
wherein a resistivity of the first conductive portion is higher than a resistivity of the second conductive portion.
2. A radio frequency module comprising:
a mounting board having a principal surface;
an electronic component comprising a plurality of external terminals, the electronic component being mounted on the principal surface of the mounting board by the plurality of external terminals;
a resin layer on the principal surface of the mounting board, the resin layer covering at least an outer perimeter surface of the electronic component; and
a conductive layer covering the resin layer, the conductive layer overlapping the electronic component in a plan view of the mounting board,
wherein the plurality of external terminals of the electronic component comprises a first radio-frequency (RF) terminal and a second RF terminal,
wherein the conductive layer comprises:
a first conductive portion between the first RF terminal and the second RF terminal in the plan view; and
a second conductive portion adjacent to the first conductive portion in the plan view, and
wherein a resistivity of the first conductive portion is higher than a resistivity of the second conductive portion.
3. The radio frequency module according to claim 1, wherein the conductive layer is in contact with an upper surface of the first electronic component and an upper surface of the second electronic component.
4. The radio frequency module according to claim 2, wherein the conductive layer is in contact with an upper surface of the electronic component.

5. The radio frequency module according to claim 3, wherein the first electronic component is a transmit system circuit component.

6. The radio frequency module according to claim 5, wherein the first electronic component is a transmit filter, and the second electronic component is a receive filter.

7. The radio frequency module according to claim 6, wherein each of the first electronic component and the second electronic component is an acoustic wave filter.

8. The radio frequency module according to claim 1, further comprising:

a transmit filter; and a receive filter, wherein the first electronic component is a surface mount type electronic component connected to the transmit filter, and wherein the second electronic component is a surface mount type electronic component connected to the receive filter.

9. The radio frequency module according to claim 1, wherein in the plan view, in a direction orthogonal to a direction along which the first RF terminal and the second RF terminal are aligned, a length of the first conductive portion is longer than a length of the first electronic component and a length of the second electronic component.

10. The radio frequency module according to claim 2, wherein the electronic component is a duplexer.

11. The radio frequency module according to claim 1, wherein the second conductive portion comprises a first stainless steel (SUS) layer, a copper (Cu) layer on the first SUS layer, and a second SUS layer on the Cu layer, and wherein the resistivity of the first conductive portion is higher than a resistivity of the Cu layer.

12. The radio frequency module according to claim 1, wherein the second conductive portion comprises a first titanium (Ti) layer, a copper (Cu) layer on the first T1 layer, and a second Ti layer on the Cu layer, and wherein the resistivity of the first conductive portion is higher than a resistivity of the Cu layer.

13. A radio frequency module comprising:

a mounting board having a principal surface;

a first electronic component comprising a plurality of first external terminals, the plurality of first external terminals comprising a first radio-frequency (RF) terminal, the first electronic component being mounted on the principal surface of the mounting board by the plurality of first external terminals;

a second electronic component comprising a plurality of second external terminals, the plurality of second external terminals comprising a second RF terminal, the second electronic component being mounted on the principal surface of the mounting board by the plurality of second external terminals;

a resin layer on the principal surface of the mounting board, the resin layer covering at least an outer perimeter surface of the first electronic component and an outer perimeter surface of the second electronic component; and a conductive layer covering the resin layer, the conductive layer overlapping the first electronic component and the second electronic component in a plan view of the mounting board, wherein the conductive layer comprises:

a first conductive portion between the first RF terminal and the second RF terminal in the plan view; and a second conductive portion adjacent to the first conductive portion in the plan view, wherein the second conductive portion comprises:

a first metal layer comprising a first metal material; and a second metal layer that is on the first metal layer and that comprises a second metal material that is different from the first metal material, and wherein the first conductive portion comprises an alloy portion comprising the first metal material and the second metal material.

14. The radio frequency module according to claim 13, wherein the first metal material is copper (Cu), and the second metal material is a material comprising iron (Fe), chromium (Cr), and nickel (Ni).

15. The radio frequency module according to claim 13, wherein the first metal material is copper (Cu), and the second metal material is titanium (Ti).

16. A communication device comprising:

the radio frequency module according to claim 1; and a signal processing circuit connected to the radio frequency module.

17. A communication device comprising:

the radio frequency module according to claim 2; and a signal processing circuit connected to the radio frequency module.

18. A communication device comprising:

the radio frequency module according to claim 13; and a signal processing circuit connected to the radio frequency module.

\* \* \* \* \*